US012349424B2

(12) United States Patent
Gardner et al.

(10) Patent No.: US 12,349,424 B2
(45) Date of Patent: Jul. 1, 2025

(54) EPITAXIAL SEMICONDUCTOR 3D HORIZONTAL NANO SHEET WITH HIGH MOBILITY 2D MATERIAL CHANNEL

(71) Applicant: Tokyo Electron Limited, Tokyo (JP)

(72) Inventors: Mark I. Gardner, Albany, NY (US); H. Jim Fulford, Albany, NY (US); Partha Mukhopadhyay, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 628 days.

(21) Appl. No.: 17/667,411

(22) Filed: Feb. 8, 2022

(65) Prior Publication Data

US 2023/0253452 A1  Aug. 10, 2023

(51) Int. Cl.
*H10D 62/10* (2025.01)
*H10D 30/01* (2025.01)
(Continued)

(52) U.S. Cl.
CPC ........ *H10D 62/118* (2025.01); *H10D 30/031* (2025.01); *H10D 30/6713* (2025.01); *H10D 30/6735* (2025.01); *H10D 30/6757* (2025.01); *H10D 84/013* (2025.01); *H10D 84/038* (2025.01)

(58) Field of Classification Search
CPC ..... H01L 29/0665–068; H01L 29/0684–0696; H01L 29/1025–1037; H01L 29/42384–42392; H01L 29/66742–6678; H01L 29/66787–66803; H01L 21/28114; H01L 29/78618; H01L 29/78696; H01L 29/66439; H01L 29/775; H01L 29/66969; H01L 29/778; H01L 29/24; H01L 27/0688; H01L 27/092; H01L 21/823807; H01L 21/823418; H01L 21/8256; B82Y 10/00; B82Y 40/00; H10D 30/481–485; H10D 30/43–435;
(Continued)

(56) References Cited

U.S. PATENT DOCUMENTS 9,024,376 B2   5/2015   Masuoka et al.
9,425,324 B2   8/2016   Diaz et al.
(Continued)

OTHER PUBLICATIONS

Kai-Shin Li et al., "MoS2 U-shape MOSFET with 10 nm channel length and poly-Si source/drain serving as seed for full wafer CVD MoS2 availability," 2016 IEEE Symposium on VLSI Technology, Honolulu, HI, USA, 2016, pp. 1-2, doi: 10.1109/VLSIT.2016.7573375. (Year: 2016).*

*Primary Examiner* — Amar Movva
*Assistant Examiner* — Eric Manuel Mulero Flores
(74) *Attorney, Agent, or Firm* — Foley & Lardner LLP

(57) ABSTRACT

Methods for the manufacture of semiconductor devices constructed with three-dimensional (3D) horizontal nano sheets with high mobility two-dimensional (2D) material channels are disclosed. Aspects can include forming a semiconductor material; selectively forming a seed material around the bridge; selectively forming a two-dimensional (2D) material around the seed material; forming an active gate around a central portion of the 2D material thereby exposing end portions of the 2D material; and growing source/drain structures coupled to the end portions of the 2D material, respectively.

11 Claims, 23 Drawing Sheets

(51) Int. Cl.
*H10D 30/67* (2025.01)
*H10D 84/01* (2025.01)
*H10D 84/03* (2025.01)

(58) Field of Classification Search
CPC ........ H10D 30/501–509; H10D 30/027–0278;
H10D 62/118–121
See application file for complete search history.

(56) References Cited

U.S. PATENT DOCUMENTS

| | | |
|---|---|---|
| 9,478,624 B2 | 10/2016 | Colinge et al. |
| 2020/0235098 A1* | 7/2020 | Li .......................... H01L 27/092 |
| 2020/0343273 A1* | 10/2020 | Huang ................. H10D 62/882 |
| 2022/0310806 A1* | 9/2022 | Yang .................... H10D 62/121 |
| 2022/0344461 A1* | 10/2022 | Jung ................. H01L 29/66545 |
| 2023/0163203 A1* | 5/2023 | Cheng ............... H01L 21/02568 |
| | | 257/29 |

* cited by examiner

Top View 100
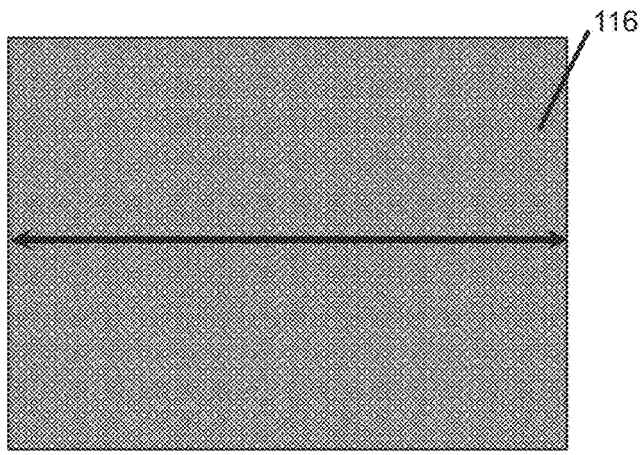
| 104 | Silicon |
| 106 | Dielectric 1 |
| 108 | Dielectric 2 |
| 110 | SiGe1 |
| 112 | SiGe 2 |
| 114 | Seed Layer Nano sheet |
| 116 | Dielectric 3 |
| 118 | Photoresist |
| 120 | Dielectric 4 |
| 122 | Metal 1 |
| 124 | Metal 2 |
| 126 | Dielectric 5 |
| 128 | Dielectric 6 |
| 130 | 2D Material |
| 132 | High-K1 |
| 134 | Metal 3 |
| 136 | High-K2 |
| 138 | Metal 4 |
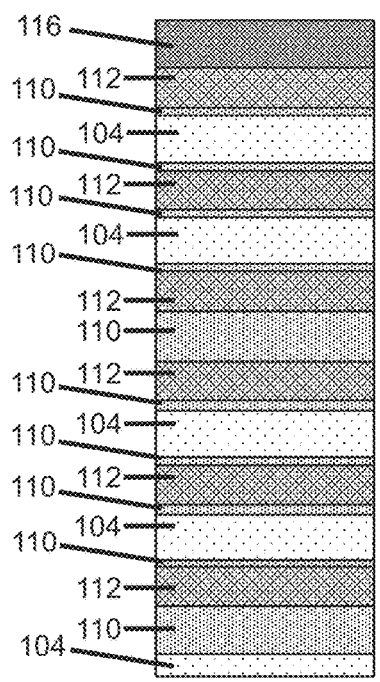
Cross-sectional View 102
*FIG. 1*

Top View 200
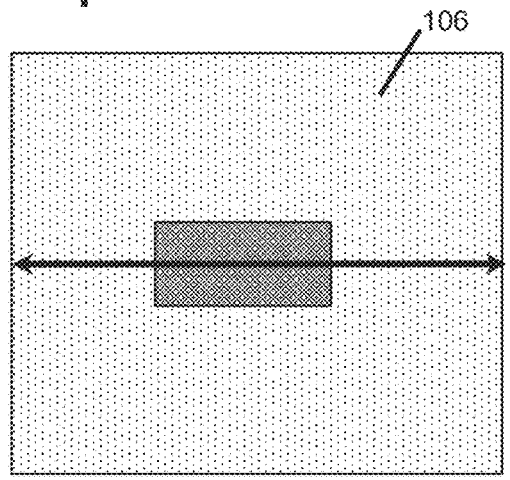
| | | |
|---|---|---|
| 104 | | Silicon |
| 106 | | Dielectric 1 |
| 108 | | Dielectric 2 |
| 110 | | SiGe1 |
| 112 | | SiGe 2 |
| 114 | | Seed Layer Nano sheet |
| 116 | | Dielectric 3 |
| 118 | | Photoresist |
| 120 | | Dielectric 4 |
| 122 | | Metal 1 |
| 124 | | Metal 2 |
| 126 | | Dielectric 5 |
| 128 | | Dielectric 6 |
| 130 | | 2D Material |
| 132 | | High-K1 |
| 134 | | Metal 3 |
| 136 | | High-K2 |
| 138 | | Metal 4 |
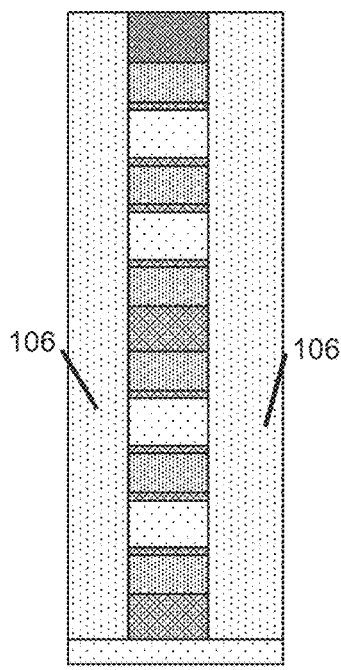
Cross-sectional View 202
*FIG. 2*

Top View 300
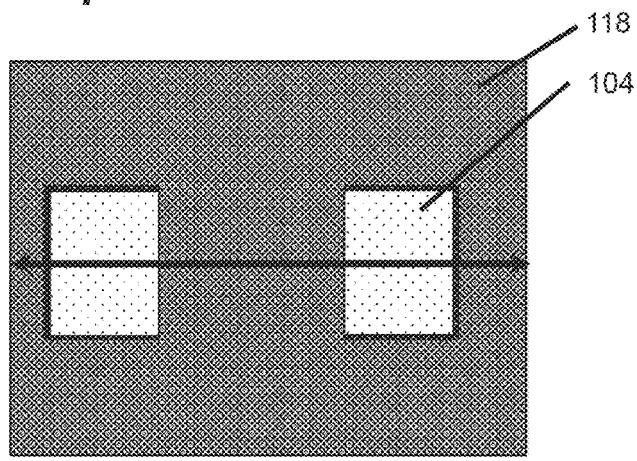
| 104 | Silicon |
| 106 | Dielectric 1 |
| 108 | Dielectric 2 |
| 110 | SiGe1 |
| 112 | SiGe 2 |
| 114 | Seed Layer Nano sheet |
| 116 | Dielectric 3 |
| 118 | Photoresist |
| 120 | Dielectric 4 |
| 122 | Metal 1 |
| 124 | Metal 2 |
| 126 | Dielectric 5 |
| 128 | Dielectric 6 |
| 130 | 2D Material |
| 132 | High-K1 |
| 134 | Metal 3 |
| 136 | High-K2 |
| 138 | Metal 4 |
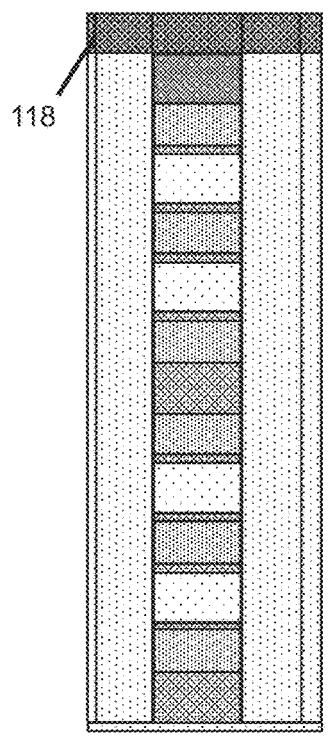
Cross-sectional View 302
*FIG. 3*

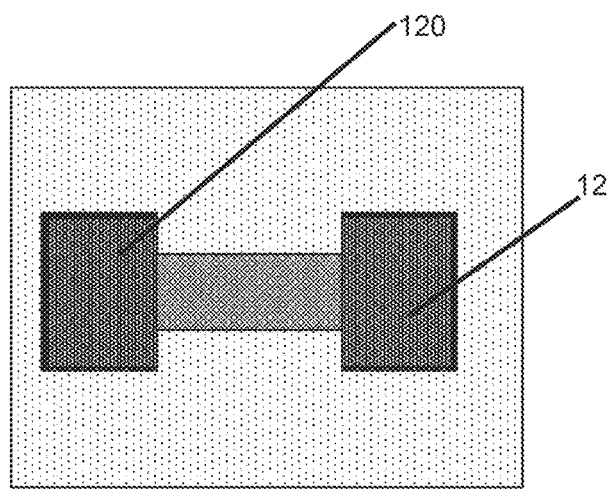
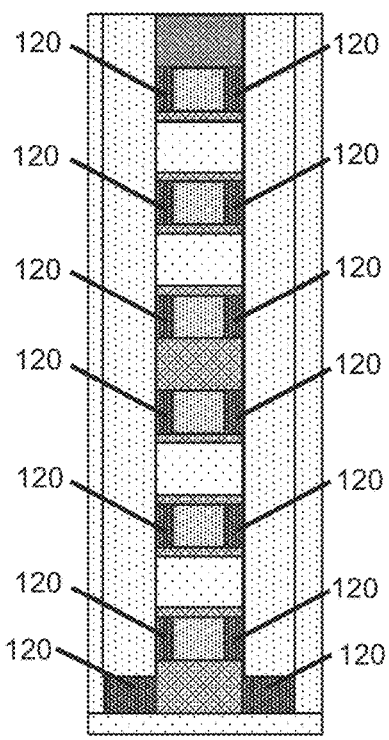
FIG. 5

Top View 600
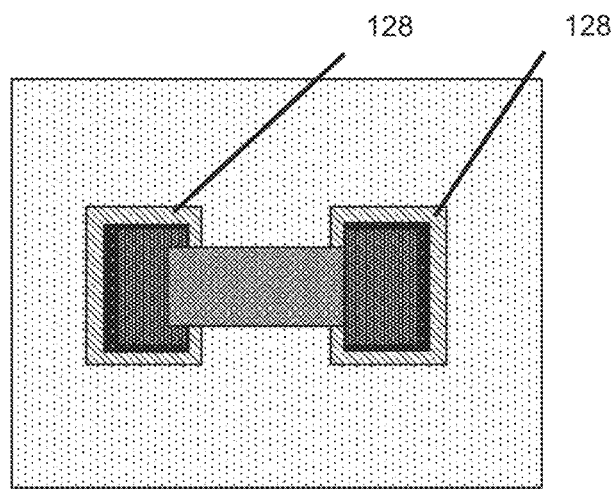
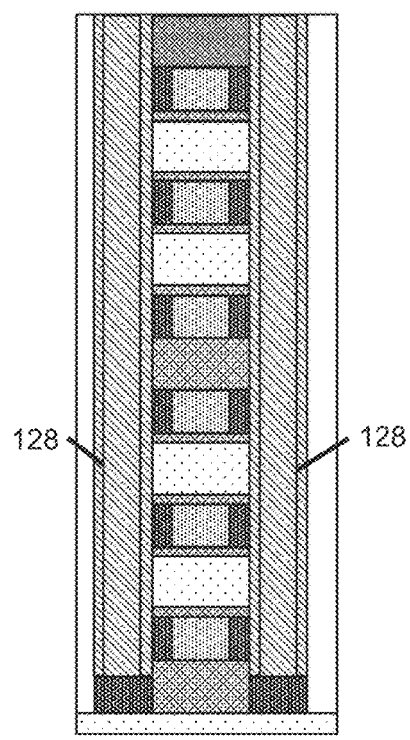
Cross-sectional View 602
*FIG. 6*

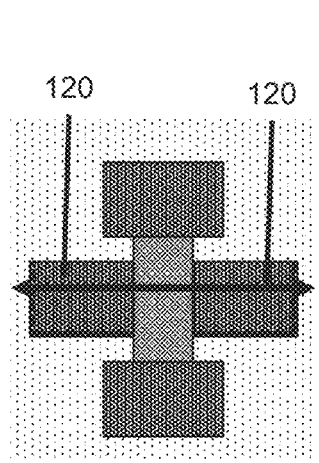
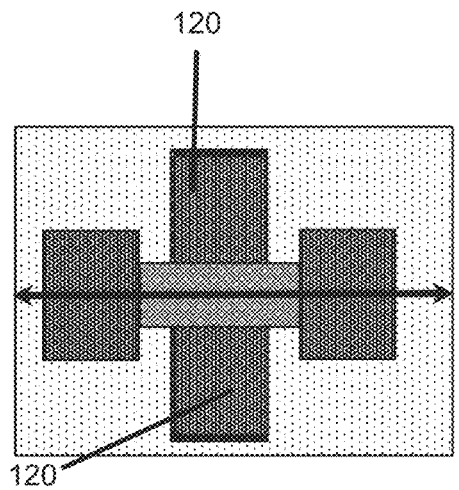
FIG. 8

Top View 900
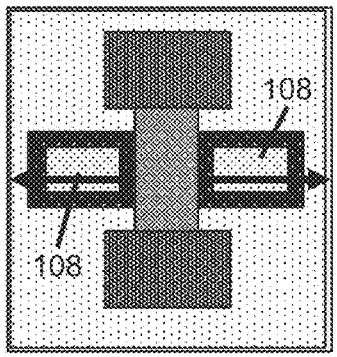
Top View 906
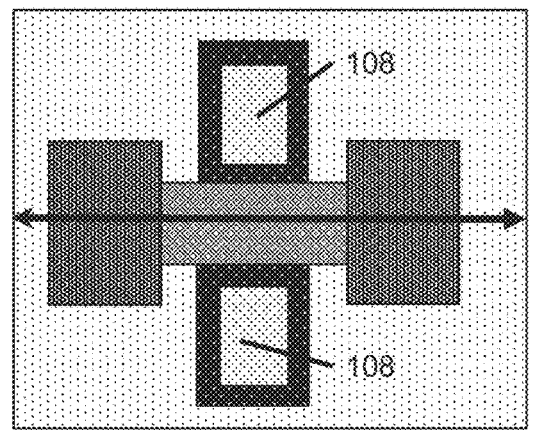
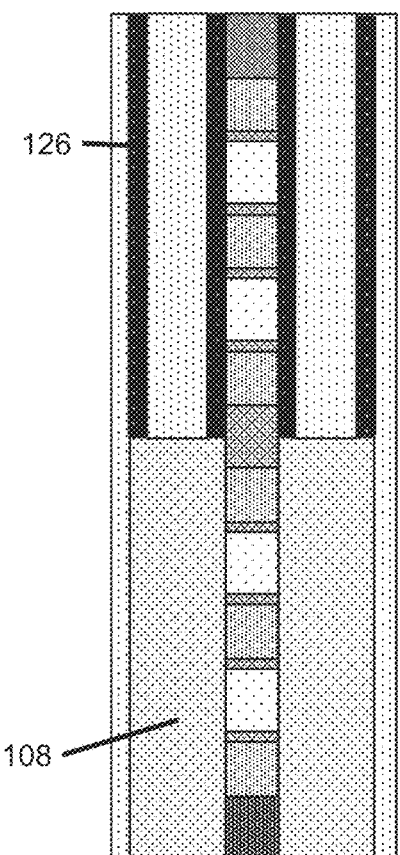
Cross-sectional View 902
| | | |
|---|---|---|
| 104 | | Silicon |
| 106 | | Dielectric 1 |
| 108 | | Dielectric 2 |
| 110 | | SiGe1 |
| 112 | | SiGe 2 |
| 114 | | Seed Layer Nano sheet |
| 116 | | Dielectric 3 |
| 118 | | Photoresist |
| 120 | | Dielectric 4 |
| 122 | | Metal 1 |
| 124 | | Metal 2 |
| 126 | | Dielectric 5 |
| 128 | | Dielectric 6 |
| 130 | | 2D Material |
| 132 | | High-K1 |
| 134 | | Metal 3 |
| 136 | | High-K2 |
| 138 | | Metal 4 |
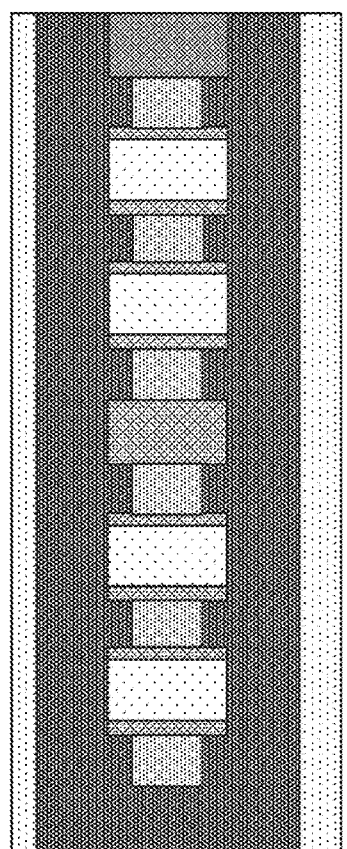
Cross-sectional View 904
*FIG. 9*

Top View 1000
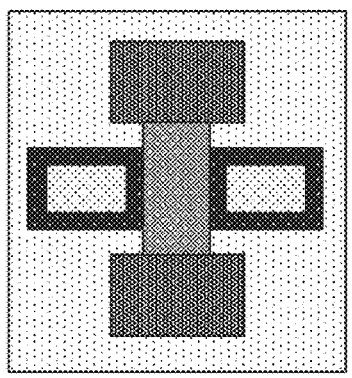
Top View 1006
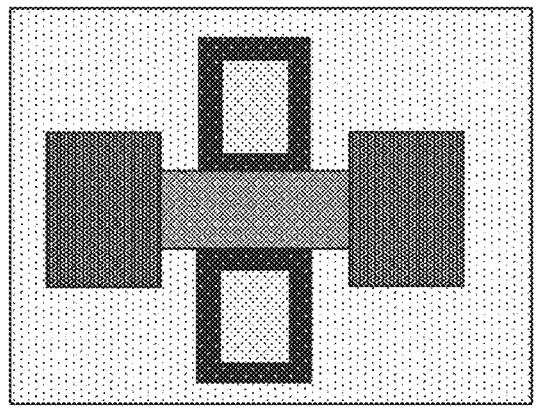
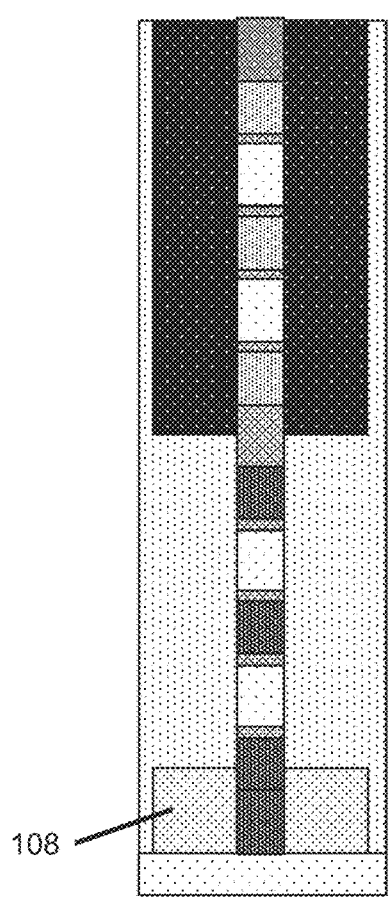
Cross-sectional View 1002
| | |
|---|---|
| 104 | Silicon |
| 106 | Dielectric 1 |
| 108 | Dielectric 2 |
| 110 | SiGe1 |
| 112 | SiGe 2 |
| 114 | Seed Layer Nano sheet |
| 116 | Dielectric 3 |
| 118 | Photoresist |
| 120 | Dielectric 4 |
| 122 | Metal 1 |
| 124 | Metal 2 |
| 126 | Dielectric 5 |
| 128 | Dielectric 6 |
| 130 | 2D Material |
| 132 | High-K1 |
| 134 | Metal 3 |
| 136 | High-K2 |
| 138 | Metal 4 |
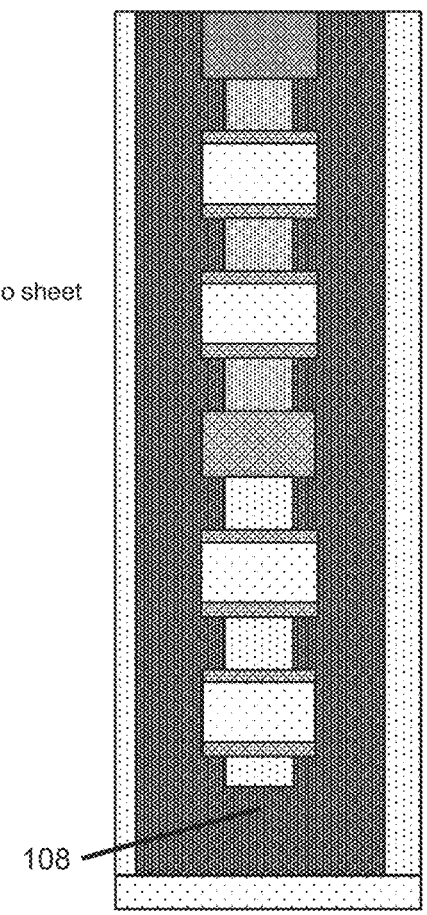
Cross-sectional View 1004
*FIG. 10*

Top View 1100
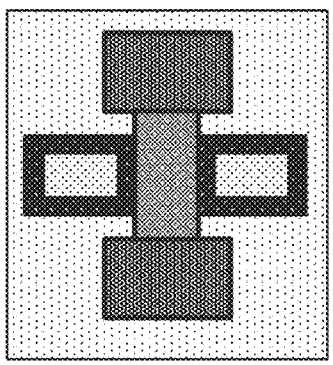
Top View 1106
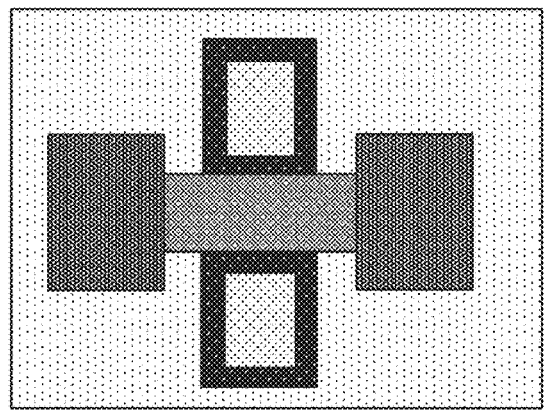
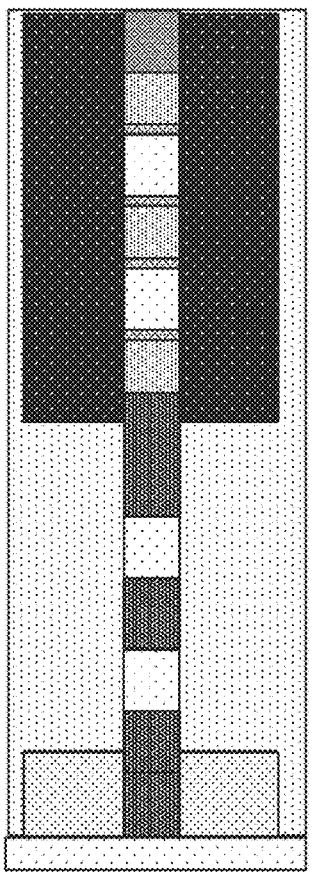
Cross-sectional View 1102
| | | |
|---|---|---|
| 104 | | Silicon |
| 106 | | Dielectric 1 |
| 108 | | Dielectric 2 |
| 110 | | SiGe1 |
| 112 | | SiGe 2 |
| 114 | | Seed Layer Nano sheet |
| 116 | | Dielectric 3 |
| 118 | | Photoresist |
| 120 | | Dielectric 4 |
| 122 | | Metal 1 |
| 124 | | Metal 2 |
| 126 | | Dielectric 5 |
| 128 | | Dielectric 6 |
| 130 | | 2D Material |
| 132 | | High-K1 |
| 134 | | Metal 3 |
| 136 | | High-K2 |
| 138 | | Metal 4 |
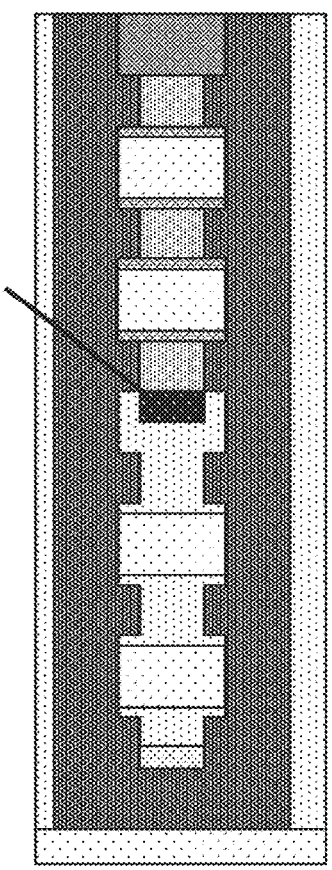
126
Cross-sectional View 1104
*FIG. 11*

Top View 1200
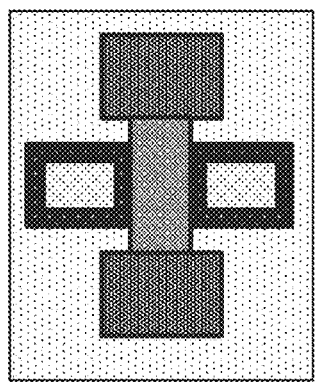
Top View 1206
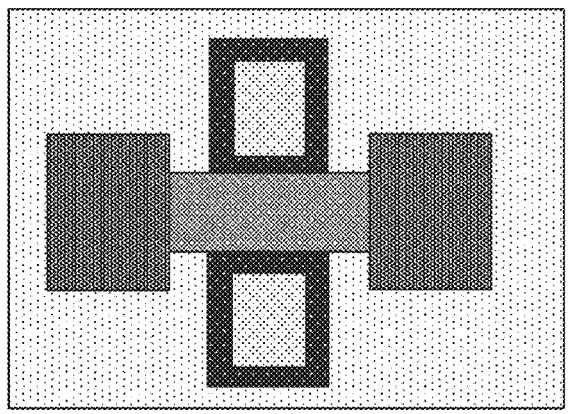
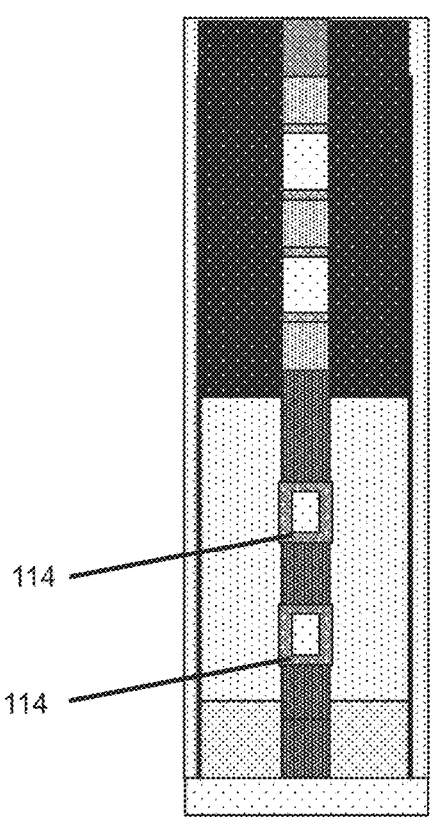
Cross-sectional
View 1202
| | | |
|---|---|---|
| 104 | | Silicon |
| 106 | | Dielectric 1 |
| 108 | | Dielectric 2 |
| 110 | | SiGe1 |
| 112 | | SiGe 2 |
| 114 | | Seed Layer Nano sheet |
| 116 | | Dielectric 3 |
| 118 | | Photoresist |
| 120 | | Dielectric 4 |
| 122 | | Metal 1 |
| 124 | | Metal 2 |
| 126 | | Dielectric 5 |
| 128 | | Dielectric 6 |
| 130 | | 2D Material |
| 132 | | High-K1 |
| 134 | | Metal 3 |
| 136 | | High-K2 |
| 138 | | Metal 4 |
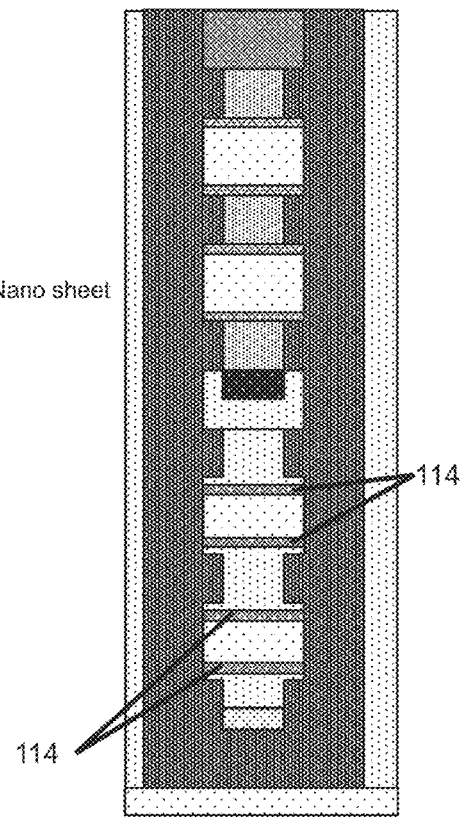
Cross-sectional
View 1204
*FIG. 12*

Top View 1300
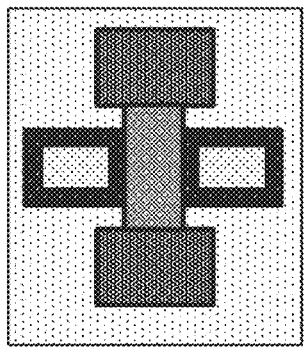
Top View 1306
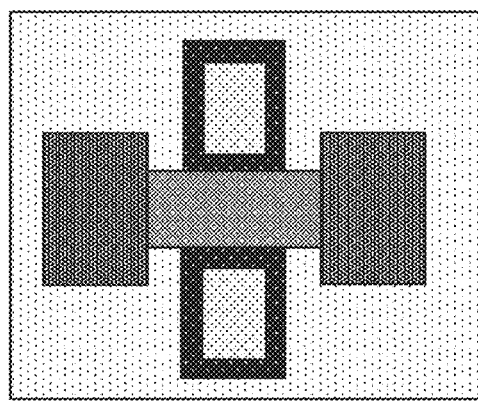
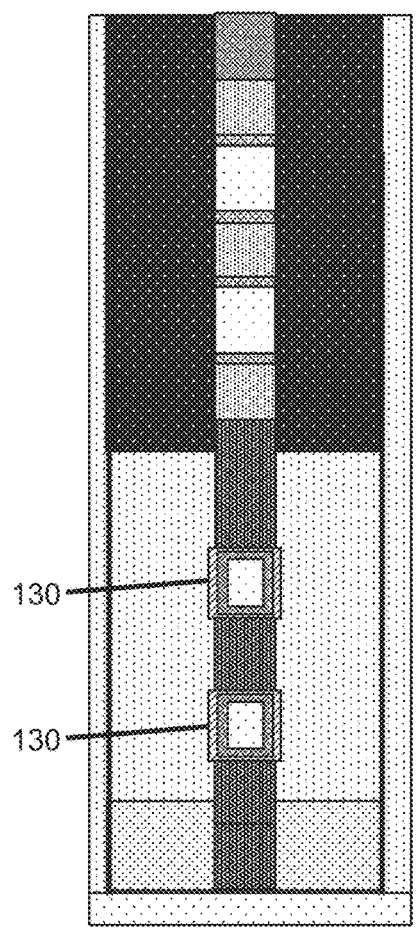
| | | |
|---|---|---|
| 104 | | Silicon |
| 106 | | Dielectric 1 |
| 108 | | Dielectric 2 |
| 110 | | SiGe1 |
| 112 | | SiGe 2 |
| 114 | | Seed Layer Nano sheet |
| 116 | | Dielectric 3 |
| 118 | | Photoresist |
| 120 | | Dielectric 4 |
| 122 | | Metal 1 |
| 124 | | Metal 2 |
| 126 | | Dielectric 5 |
| 128 | | Dielectric 6 |
| 130 | | 2D Material |
| 132 | | High-K1 |
| 134 | | Metal 3 |
| 136 | | High-K2 |
| 138 | | Metal 4 |
Cross-sectional View 1302
Cross-sectional View 1304

Top View 1400
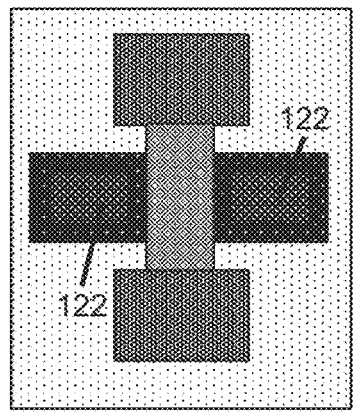
Top View 1406
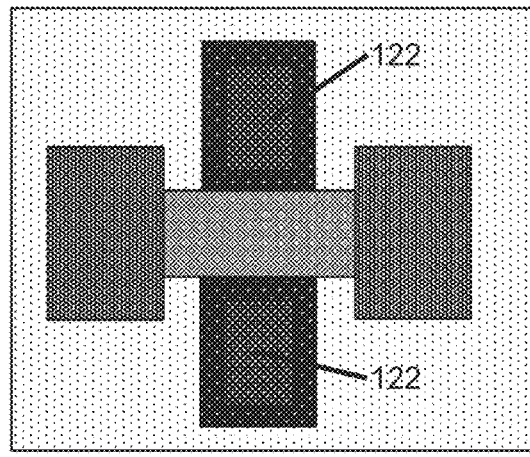
Cross-sectional View 1402
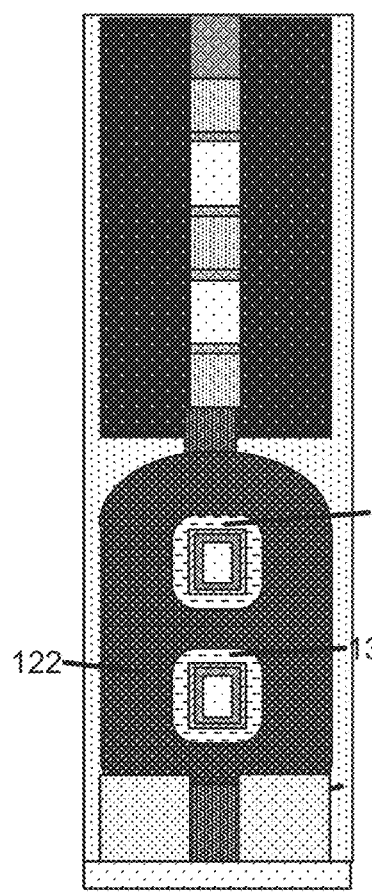
| | | |
|---|---|---|
| 104 | | Silicon |
| 106 | | Dielectric 1 |
| 108 | | Dielectric 2 |
| 110 | | SiGe1 |
| 112 | | SiGe 2 |
| 114 | | S.L Nano sheet |
| 116 | | Dielectric 3 |
| 118 | | Photoresist |
| 120 | | Dielectric 4 |
| 122 | | Metal 1 |
| 124 | | Metal 2 |
| 126 | | Dielectric 5 |
| 128 | | Dielectric 6 |
| 130 | | 2D Material |
| 132 | | High-K1 |
| 134 | | Metal 3 |
| 136 | | High-K2 |
| 138 | | Metal 4 |
Cross-sectional View 1404
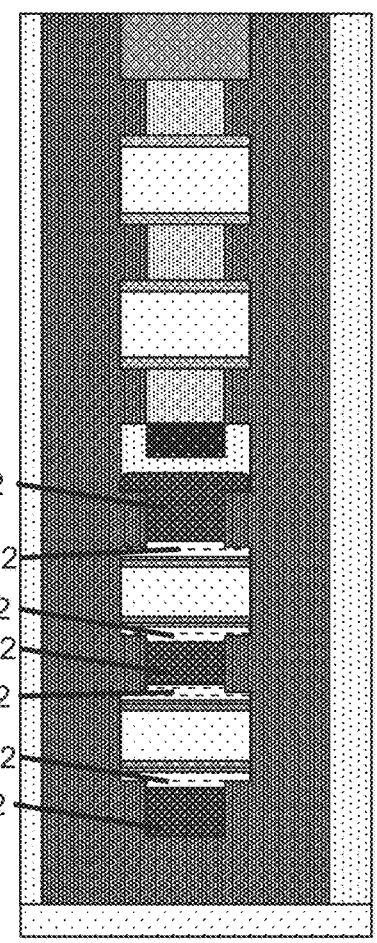
*FIG. 14*

Top View 1500
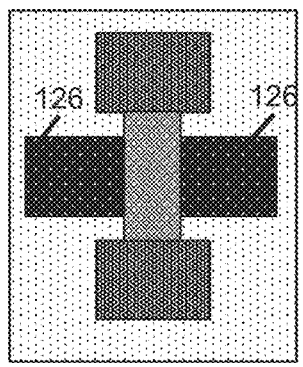
Top View 1506
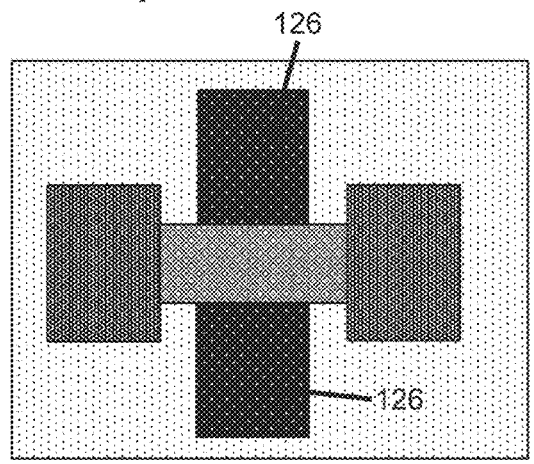
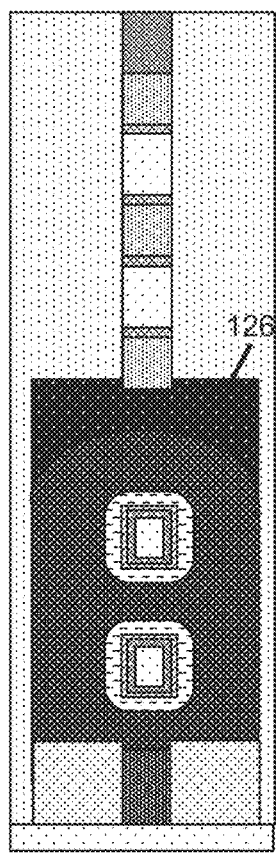
Cross-sectional
View 1502
| | | |
|---|---|---|
| 104 | | Silicon |
| 106 | | Dielectric 1 |
| 108 | | Dielectric 2 |
| 110 | | SiGe1 |
| 112 | | SiGe 2 |
| 114 | | Seed Layer Nano sheet |
| 116 | | Dielectric 3 |
| 118 | | Photoresist |
| 120 | | Dielectric 4 |
| 122 | | Metal 1 |
| 124 | | Metal 2 |
| 126 | | Dielectric 5 |
| 128 | | Dielectric 6 |
| 130 | | 2D Material |
| 132 | | High-K1 |
| 134 | | Metal 3 |
| 136 | | High-K2 |
| 138 | | Metal 4 |
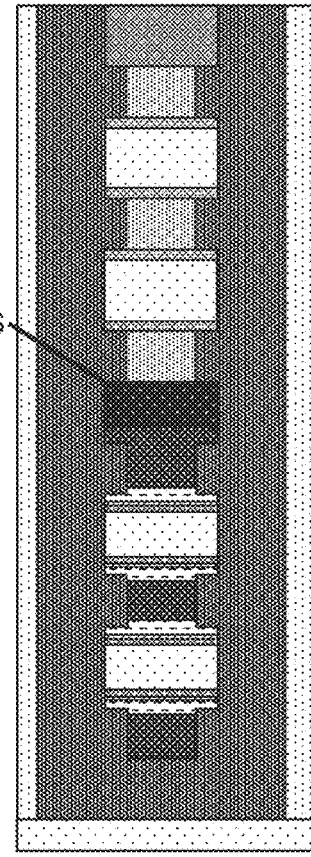
Cross-sectional
View 1504
*FIG. 15*

Top View 1600
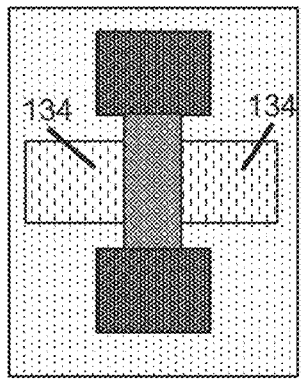
Top View 1606
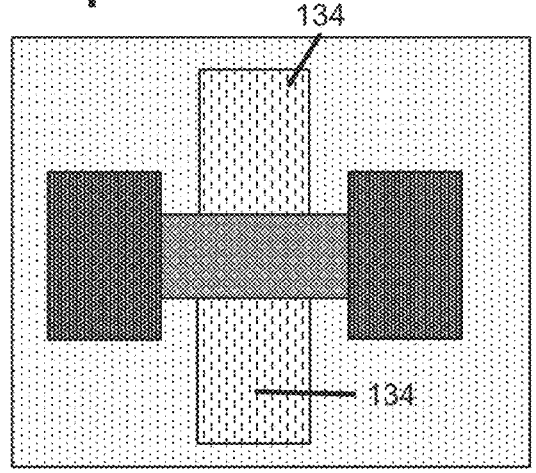
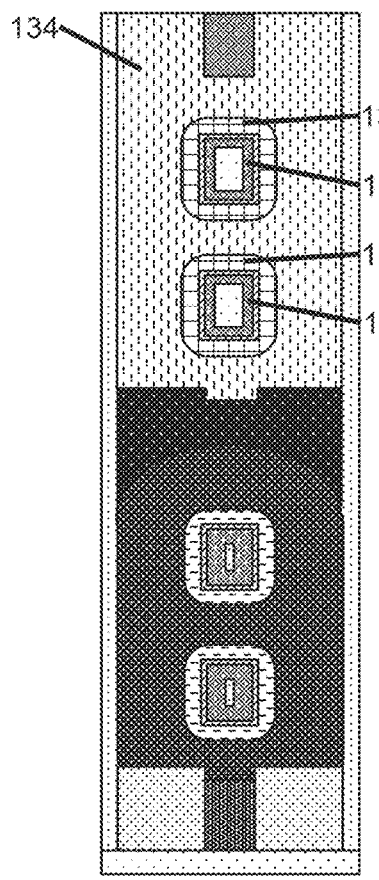
Cross-sectional
View 1602
| | | |
|---|---|---|
| 104 | | Silicon |
| 106 | | Dielectric 1 |
| 108 | | Dielectric 2 |
| 110 | | SiGe1 |
| 112 | | SiGe 2 |
| 114 | | S.L. Nano sheet |
| 116 | | Dielectric 3 |
| 118 | | Photoresist |
| 120 | | Dielectric 4 |
| 122 | | Metal 1 |
| 124 | | Metal 2 |
| 126 | | Dielectric 5 |
| 128 | | Dielectric 6 |
| 130 | | 2D Material |
| 132 | | High-K1 |
| 134 | | Metal 3 |
| 136 | | High-K2 |
| 138 | | Metal 4 |
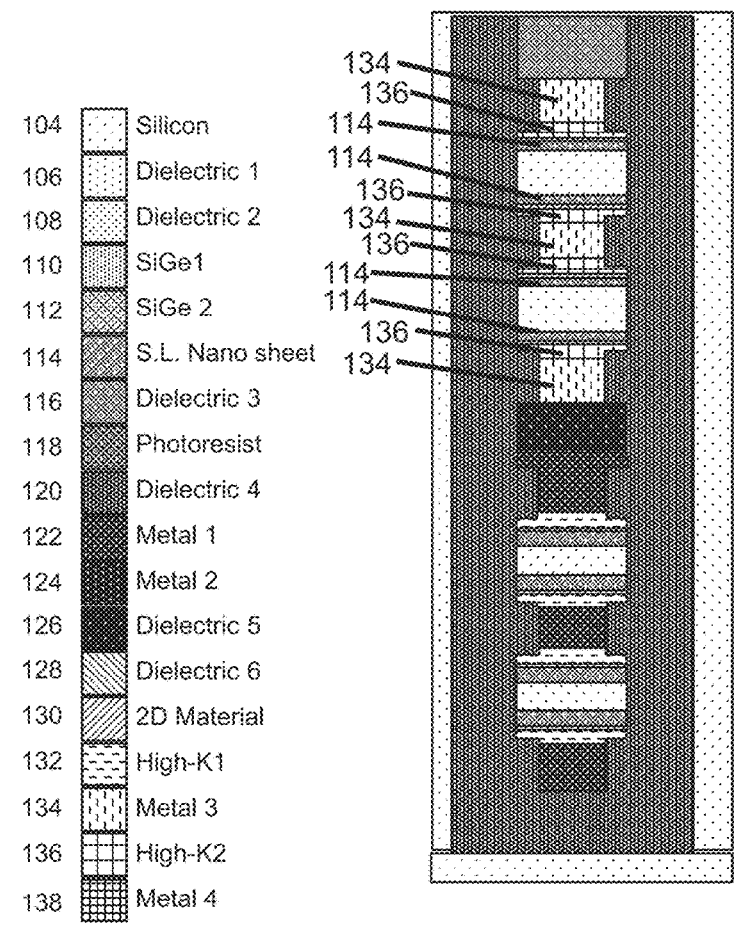
Cross-sectional
View 1604
*FIG. 16*

Top View 1700
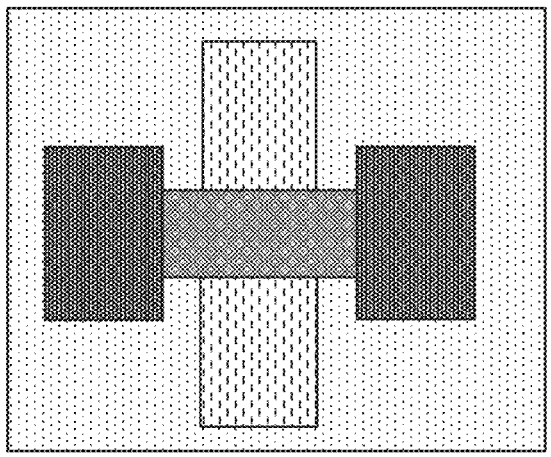
| | | |
|---|---|---|
| 104 | | Silicon |
| 106 | | Dielectric 1 |
| 108 | | Dielectric 2 |
| 110 | | SiGe 1 |
| 112 | | SiGe 2 |
| 114 | | Seed Layer Nano sheet |
| 116 | | Dielectric 3 |
| 118 | | Photoresist |
| 120 | | Dielectric 4 |
| 122 | | Metal 1 |
| 124 | | Metal 2 |
| 126 | | Dielectric 5 |
| 128 | | Dielectric 6 |
| 130 | | 2D Material |
| 132 | | High-K1 |
| 134 | | Metal 3 |
| 136 | | High-K2 |
| 138 | | Metal 4 |
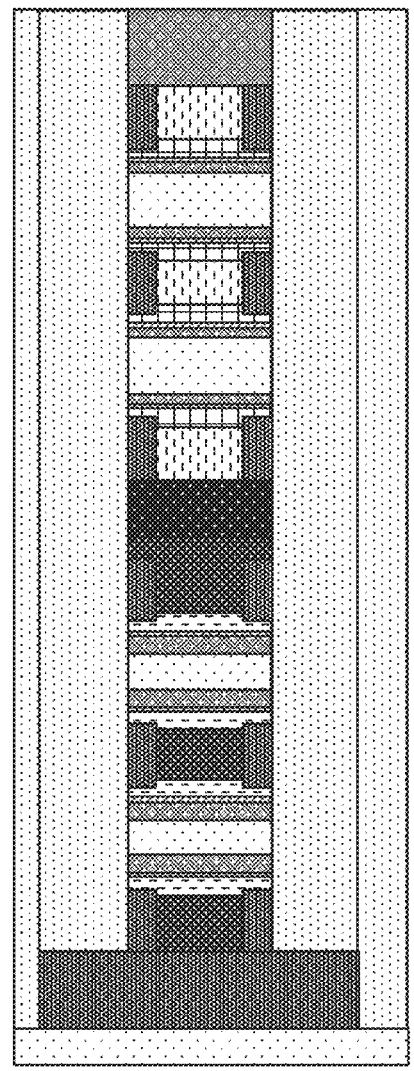
Cross-sectional View 1702
*FIG. 17*

Top View 1800
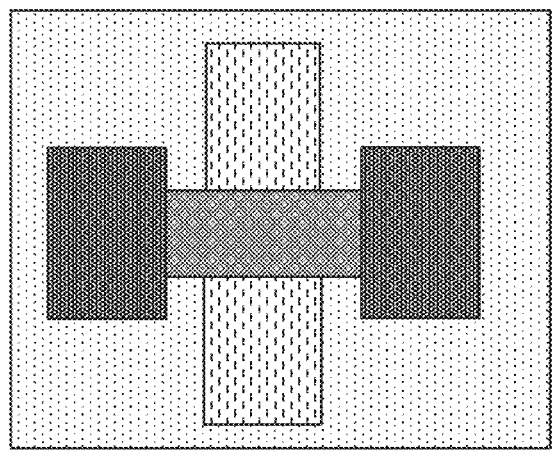
| | | |
|---|---|---|
| 104 | | Silicon |
| 106 | | Dielectric 1 |
| 108 | | Dielectric 2 |
| 110 | | SiGe1 |
| 112 | | SiGe 2 |
| 114 | | Seed Layer Nano sheet |
| 116 | | Dielectric 3 |
| 118 | | Photoresist |
| 120 | | Dielectric 4 |
| 122 | | Metal 1 |
| 124 | | Metal 2 |
| 126 | | Dielectric 5 |
| 128 | | Dielectric 6 |
| 130 | | 2D Material |
| 132 | | High-K1 |
| 134 | | Metal 3 |
| 136 | | High-K2 |
| 138 | | Metal 4 |
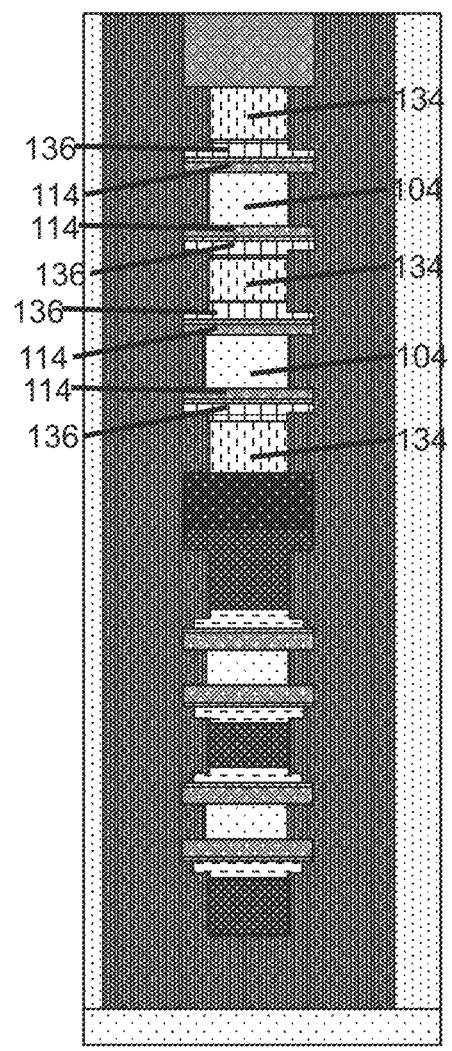
Cross-sectional View 1802
*FIG. 18*

Top View 1900
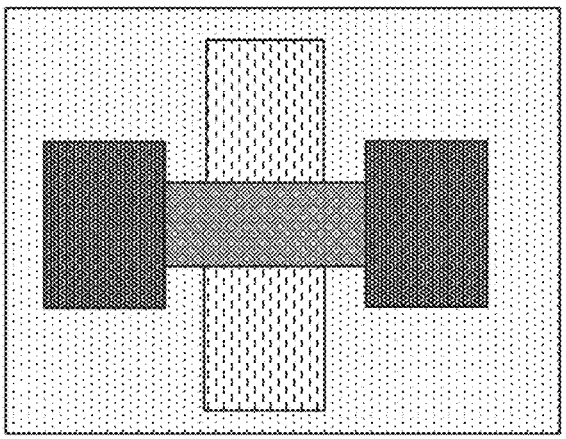
| | |
|---|---|
| 104 | Silicon |
| 106 | Dielectric 1 |
| 108 | Dielectric 2 |
| 110 | SiGe1 |
| 112 | SiGe 2 |
| 114 | Seed Layer Nano sheet |
| 116 | Dielectric 3 |
| 118 | Photoresist |
| 120 | Dielectric 4 |
| 122 | Metal 1 |
| 124 | Metal 2 |
| 126 | Dielectric 5 |
| 128 | Dielectric 6 |
| 130 | 2D Material |
| 132 | High-K1 |
| 134 | Metal 3 |
| 136 | High-K2 |
| 138 | Metal 4 |
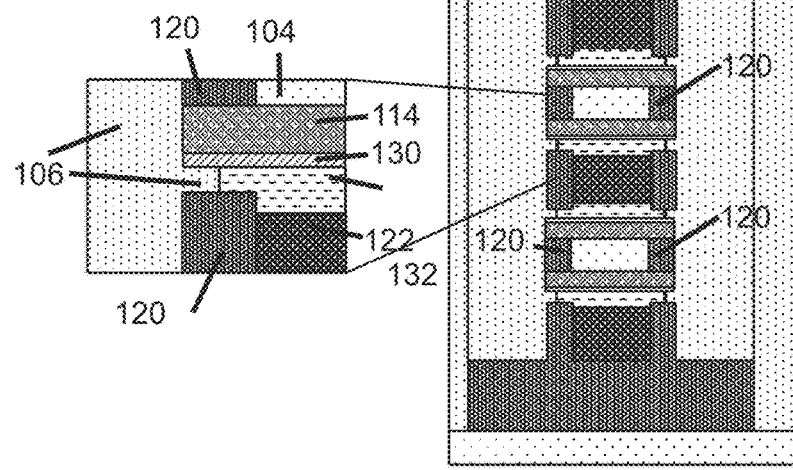
Cross-sectional View 1902
*FIG. 19*

Top View 2000
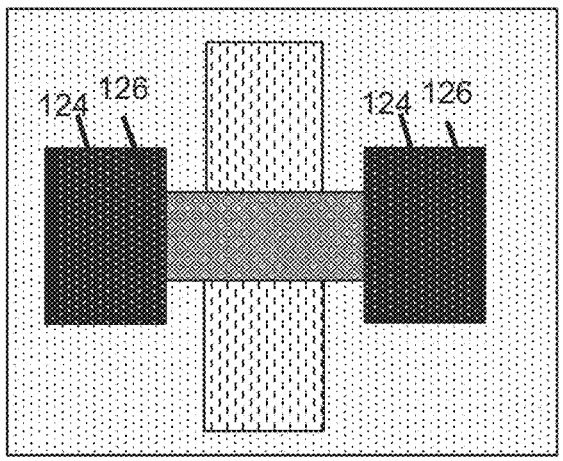
| | | |
|---|---|---|
| 104 | | Silicon |
| 106 | | Dielectric 1 |
| 108 | | Dielectric 2 |
| 110 | | SiGe1 |
| 112 | | SiGe 2 |
| 114 | | Seed Layer Nano sheet |
| 116 | | Dielectric 3 |
| 118 | | Photoresist |
| 120 | | Dielectric 4 |
| 122 | | Metal 1 |
| 124 | | Metal 2 |
| 126 | | Dielectric 5 |
| 128 | | Dielectric 6 |
| 130 | | 2D Material |
| 132 | | High-K1 |
| 134 | | Metal 3 |
| 136 | | High-K2 |
| 138 | | Metal 4 |
Zoomed View 2004
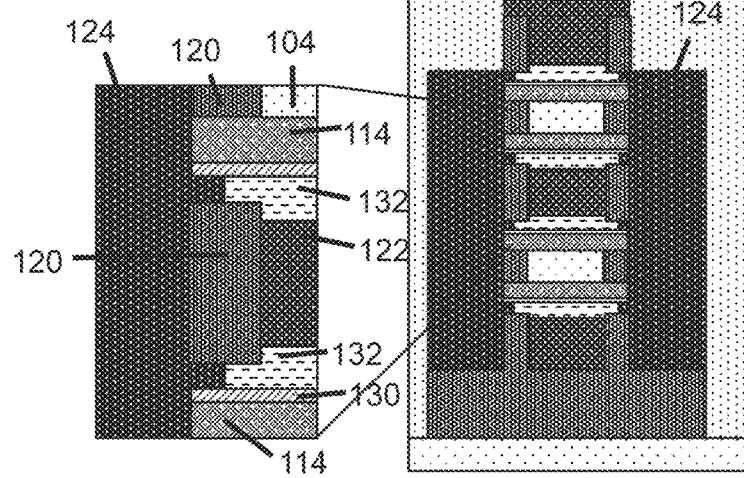
Cross-sectional View 2002
*FIG. 20*

Top View 2100
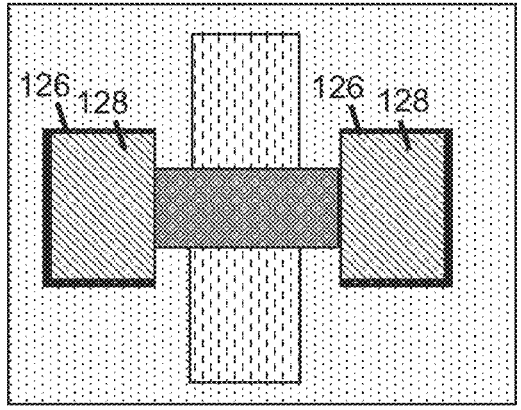
| | | |
|---|---|---|
| 104 | | Silicon |
| 106 | | Dielectric 1 |
| 108 | | Dielectric 2 |
| 110 | | SiGe1 |
| 112 | | SiGe 2 |
| 114 | | Seed Layer Nano sheet |
| 116 | | Dielectric 3 |
| 118 | | Photoresist |
| 120 | | Dielectric 4 |
| 122 | | Metal 1 |
| 124 | | Metal 2 |
| 126 | | Dielectric 5 |
| 128 | | Dielectric 6 |
| 130 | | 2D Material |
| 132 | | High-K1 |
| 134 | | Metal 3 |
| 136 | | High-K2 |
| 138 | | Metal 4 |
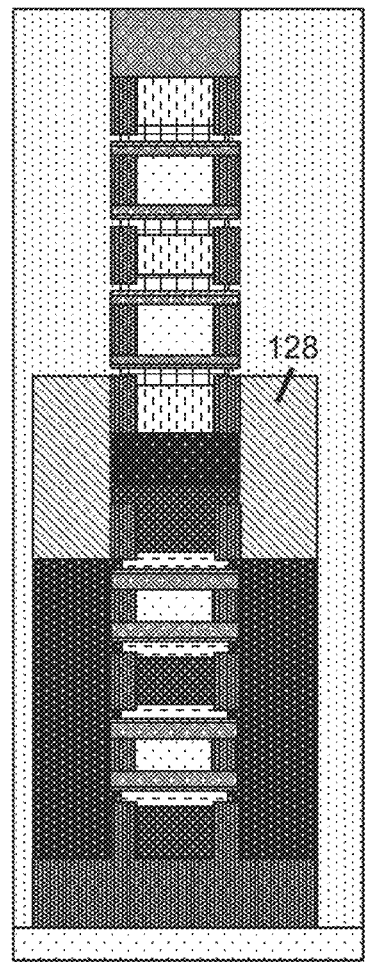
Cross-sectional View 2102
*FIG. 21*

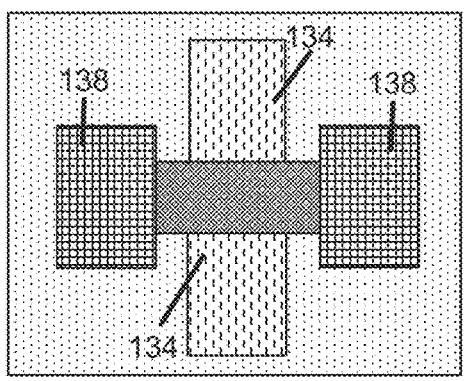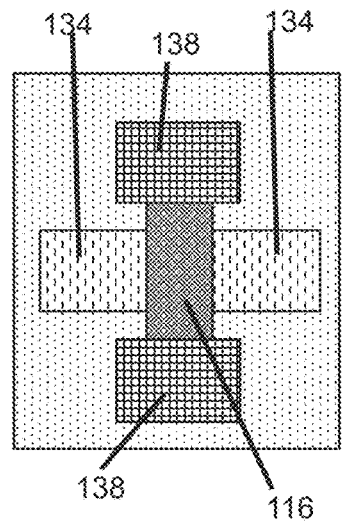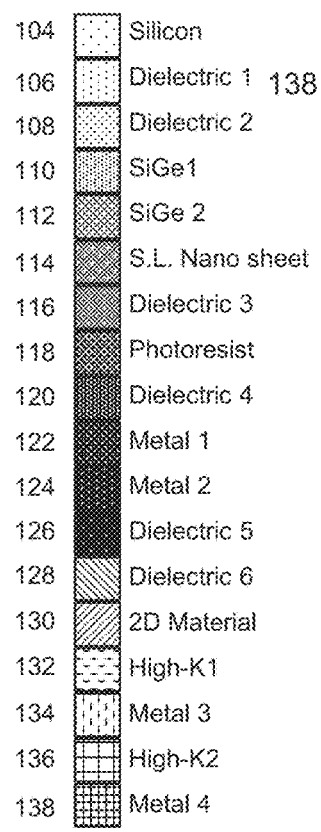
FIG. 22

2300

Form a dielectric material on a first side and a second side of a stack of layers, the stack of layers including a layer of a semiconductor material, and remove one more layers of the stack of layers to expose the semiconductor material, wherein a first end of the semiconductor material contacts the first side of the dielectric layer and a second end of the semiconductor material contacts the second side of the dielectric layer 2305

Selectively form a seed material around the bridge 2310

Selectively form a 2D material around the seed material 2315

Form an active gate around a central portion of the 2D material, thereby exposing end portions of the 2D material 2320

Grow source/drain structures in contact with the end portions of the 2D material, respectively 2325

*FIG. 23*

EPITAXIAL SEMICONDUCTOR 3D HORIZONTAL NANO SHEET WITH HIGH MOBILITY 2D MATERIAL CHANNEL

TECHNICAL FIELD

The present invention relates generally to the field of manufacturing semiconductor devices.

BACKGROUND

In the manufacture of a semiconductor devices (especially on the microscopic scale), various fabrication processes are executed, such as film-forming depositions, etch mask creation, patterning, material etching and removal, and doping treatments. These processes are performed repeatedly to form desired semiconductor device elements on a substrate. Conventional fabrication techniques only manufacture transistors in one plane, while wiring or metallization is formed above the active device plane. Such devices are accordingly characterized as two-dimensional (2D) circuits, manufactured using 2D fabrication techniques. Although scaling efforts have greatly increased the number of transistors per unit area in 2D circuits, these 2D fabrication techniques are approaching physical atomic limitations with single digit nanometer semiconductor device fabrication nodes. Semiconductor device fabricators have expressed a desire for semiconductor circuits in which transistors have increased complexity and dimensionality.

SUMMARY

A variety of semiconductor devices that integrate 2D materials are proposed and aim to overcome scaling limitations experienced in planar devices by increasing transistor density in volume rather than area. The devices and methods may utilize nano sheet masks to form openings in stacks of layers, allowing for precise deposition or formation of 2D materials and other semiconductor materials. Such 2D materials have the potential for very high mobility, and therefore enable sub-nanometer channel thickness regions. Such techniques can enable future nanoscale transistors, which may be implemented in a variety of logical circuits, including central processing units (CPUs), graphics processing units (GPUs), and field-programmable gate arrays (FPGAs).

In one embodiment, a method may comprise forming a dielectric material on a first side and a second side of a stack of layers, the stack of layers including a layer of a semiconductor material; removing one more layers of the stack of layers to expose the semiconductor material, wherein a first end of the semiconductor material contacts the first side of the dielectric layer and a second end of the semiconductor material contacts the second side of the dielectric layer; selectively forming a seed material around the semiconductor material; selectively forming a two-dimensional (2D) material around the seed material; forming an active gate around a central portion of the 2D material, thereby exposing end portions of the 2D material; and forming source/drain structures in contact with the end portions of the 2D material, respectively.

The stack of layers may include one or more layers of a sacrificial material on the semiconductor material. Forming the seed material and the 2D material may comprise replacing the one or more layers of the sacrificial material with the seed material and the 2D material. The method may further comprise etching the first end of the semiconductor material and the second end of the semiconductor material. Forming the active gate may comprise forming a high-k dielectric material on the 2D material; and forming a gate metal on the high-k dielectric material.

The method may further comprise etching the semiconductor material to create a recessed opening in the semiconductor material; and forming the dielectric material in the recessed opening. Forming the source/drain structures may further comprise etching a portion of the active gate to create a recessed gate opening that exposes a second portion of the 2D material; and forming the source/drain structures coupled to the portion of the 2D material and the second portion of the 2D material.

The method may further comprise removing one or more second layers of the stack of layers to expose a second semiconductor material, wherein a first end of the second semiconductor material contacts the first side of the dielectric layer and a second end of the second semiconductor material contacts the second side of the dielectric layer; selectively forming a second seed material around the second semiconductor material; selectively forming a second 2D material around the second seed material; forming a second active gate around a central portion of the second 2D material, thereby exposing end portions of the second 2D material; and forming second source/drain structures in contact with the end portions of the second 2D material, respectively.

In another embodiment, a device may comprise a semiconductor material; a pair of first dielectric materials in contact with both ends of the semiconductor material, respectively; a seed material around the semiconductor material and the pair of dielectric materials; a two-dimensional (2D) material around the seed material; an active gate around the 2D material; and a pair of source/drain structures in contact with the 2D material.

The device may further comprise a pair of second dielectric materials coupled to both ends of an upper portion of the active gate; and a pair of third dielectric materials coupled to both ends of a lower portion of the active gate. The pair of second dielectric materials may be configured to electrically isolate at least the upper portion of the active gate from the pair of source/drain structures, and the pair of third dielectric materials may be configured to electrically isolate at least the lower portion of the active gate from the pair of source/drain structures.

The seed material may include an oxidized portion of the semiconductor material. The active gate may comprise a high-k dielectric material around a portion of the 2D material; and a gate metal around a portion of the high-k dielectric material. The portion of the 2D material may have a first length and the portion of the high-k dielectric material may have a second length, where the first length is longer than the second length.

The device may further comprise a second semiconductor material; a second pair of second dielectric materials in contact with both ends of the second semiconductor material, respectively; a second seed material around the second semiconductor material and the second pair of second dielectric materials; a second 2D material around the second seed material; a second active gate around the second 2D material; and a second pair of source/drain structures coupled to the 2D material. The 2D material may be an N-type material and the second 2D material may be a P-type material.

In yet another embodiment, a transistor structure may comprise a source metal; a drain metal; a two-dimensional (2D) channel material partially around a semiconductor material that extends between the source metal and the drain metal; a high-k dielectric partially around the 2D channel material; a gate metal partially around the high k-dielectric; and a dielectric isolating the gate metal from the source metal and the drain metal.

The transistor structure may further comprise a seed material around the semiconductor material, wherein the 2D channel material is coupled to the seed material. The source metal and the drain metal may be separated from the semiconductor material by a second dielectric. The source metal and the drain metal may be coupled to the 2D channel material and the high-k dielectric material.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustration and a further understanding of the various aspects and implementations, and are incorporated in and constitute a part of this specification. Aspects can be combined and it will be readily appreciated that features described in the context of one aspect of the invention can be combined with other aspects. Aspects can be implemented in any convenient form. As used in the specification and in the claims, the singular form of 'a', 'an', and 'the' include plural referents unless the context clearly dictates otherwise.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure. For purposes of clarity, not every component may be labeled in every drawing. In the drawings:

FIGS. 1-22 show various views of a process flow to manufacture epitaxial semiconductor devices using 3D horizontal nano sheets with 2D materials, according to an embodiment; and FIG. 23 shows flow a diagram of an example method for fabricating devices using the process flows described in connection with FIGS. 1-22, according to an embodiment.

DETAILED DESCRIPTION

Figure 4:
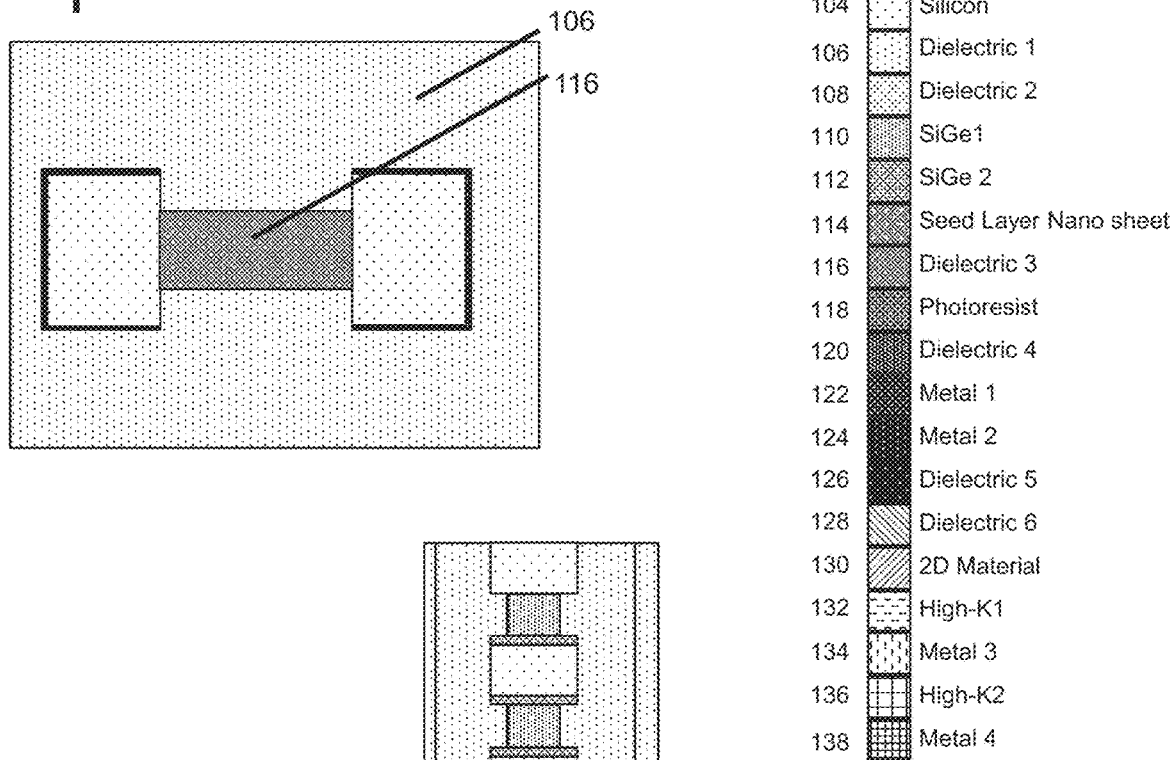

Reference will now be made to the illustrative embodiments depicted in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one skilled in the relevant art and having possession of this disclosure, are to be considered within the scope of the subject matter disclosed herein. Other embodiments may be used and/or other changes may be made without departing from the spirit or scope of the present disclosure. The illustrative embodiments described in the detailed description are not meant to be limiting of the subject matter presented.

The embodiments described herein enable the formation of semiconductor devices made using 3D nano sheets with 2D materials transistor channels. The semiconductor devices can be manufactured using epitaxial growth techniques and by using different $Si_XGe_{1-X}$ (where X is equal to mole fraction) material layers for highly conductive transistor channels using 2D materials. The 2D materials can be formed on a seed material.

The present techniques include providing 2D materials in conjunction with conductive oxides as an under layer in transistor devices. The use of a conductive under layer can provide improved connections between the sources and drains of the transistor devices. Because the 2D material has a significant boost in performance relative to other semiconductive materials, such as silicon, the present techniques provide devices having improved performance compared to conventional semiconductor devices. Additionally, the present techniques allow for increased 3D stacking of semiconductor devices and allows for a stack of N devices, rather than conventional single-layer devices. The present techniques can be used to create any type of semiconductive device, including NMOS devices, PMOS devices, and CFET devices. The process steps described herein may be implemented utilizing pre-aligned masks to improve etching various layers or openings during device fabrication.

Reference will now be made to the figures, which for the convenience of visualizing the fabrication techniques described herein, illustrate a variety of materials undergoing a process flow in various views. Unless expressly indicated otherwise, each Figure represents one (or a set) of fabrication steps in a process flow for manufacturing the devices described herein. In the various views of the Figures, connections between conductive layers or materials may or may not be shown. However, it should be understood that connections between various layers, masks, or materials may be implemented in any configuration to create electric or electronic circuits. When such connections are shown, it should be understood that such connections are merely illustrative, and are intended to show a capability for providing such connections, and should not be considered limiting to the scope of the claims.

Likewise, although the Figures and aspects of the disclosure may show or describe devices herein as having a particular shape, it should be understood that such shapes are merely illustrative and should not be considered limiting to the scope of the techniques described herein. For example, the techniques described herein may be implemented in any shape or geometry for any material or layer to achieve desired results. In addition, examples in which two transistors or devices are shown stacked on top of one another are shown for illustrative purposes only, and for the purposes of simplicity. Indeed, the techniques described herein may provide for one to any number of stacked devices. Further, although the devices fabricated using these techniques are shown as transistors, it should be understood that any type of electric electronic device may be manufactured using such techniques, including but not limited to transistors, variable resistors, resistors, and capacitors.

FIGS. 1-22 show various views of a process flow to manufacture epitaxial semiconductor devices using 3D horizontal nano sheets with 2D materials, according to an embodiment. Each of the FIGS. 1-22 generally refer to one or more process steps in a process flow, each of which are described in detail in connection with a respective Figure. For the purposes of simplicity and ease of visualization, some reference numbers may be omitted from some Figures. Referring to FIG. 1, illustrated is a top view 100 and a cross-sectional view 102 of a base structure (shown here as a stack of layers, however, any base structure can be used in connection with the techniques described herein). The techniques described herein may be used to form material on a base layer 104 which in these example process flows is shown as silicon ("Silicon" in the legend, and the material making up the base layer may be referred to as "silicon 104"). The layers formed on the base layer 104 can include one or more 3D nano sheet layers, which may be formed using any suitable material deposition technique, including atomic layer deposition (ALD), chemical vapor deposition (CVD), physical vapor deposition (PVD), plasma-enhanced CVD (PECVD), or epitaxial growth or deposition techniques. As used herein, the terms "first," "second," "third," and "fourth" with respect to particular layers refer to the order of the layers relative to the base layer 104. For example, a "first" layer of a particular type refers to the specified type of layer that is closest to the base layer 104. Likewise, a "second" layer of a particular type refers to the specified type of layer that is second closest to the base layer 104, and so on.

Alternating layers of sacrificial material may be grown on top of the base layer 104. As shown, a layer of a first sacrificial material 110 (shown as "SiGe1" in the legend) is formed on the base layer 104, and a second sacrificial material 112 (shown as "SiGe 2" in the legend) is formed on the layer of the first sacrificial material. The first sacrificial material 110 may be SiGe, and the second sacrificial material may be $SiGe_2$. Any type of $Si_XGe_{1-X}$ material (where X is equal to the respective mole fraction of Si) may be used. Although silicon-based examples are provided in this process flow, any semiconductor material may be utilized. Similarly, different types of sacrificial materials may also be used. A second layer of the first sacrificial material 110 can then be formed on the second sacrificial material 112, and then a layer of silicon 104 can be formed on the second layer of the first sacrificial material 110. A layer of the first sacrificial material is then formed on the silicon 104. As shown, alternating layers of the first sacrificial material 110, the second sacrificial material 112, and the silicon 104 can be formed in the stack of layers that may define a number of vertically stacked transistor structures. Each of the first sacrificial material 110, the second sacrificial material 112, and the silicon 104 can be formed using epitaxial growth or formation techniques, using the prior layer as a seed layer. The silicon 104 can be formed as a 3D nano sheet structure (e.g., having a thickness in the nanometer range, etc.). After forming all of the layers of the first sacrificial material 110, the second sacrificial material 112, and the silicon 104, a layer of a first dielectric material 116 (shown as "Dielectric 3" in the legend) can be formed at the top of the device. A chemical-mechanical polish (CMP) process may be performed prior to further process steps.

Referring to FIG. 2, illustrated is a top view 200 and a cross-sectional view 202 of the next stage in the process flow. At this stage in the process flow, the stack of layers formed on the base layer 104 can be etched to a desired width and length, as shown in the top view 200. Although the stack of layers has been etched in a rectangle shape, it should be understood that the stack of layers can be formed in any desired geometry. The width or length can be chosen based on desired electrical characteristics of the device. Any suitable etching or material removal technique can be used, including but not limited to dry etching, wet etching, or plasma etching techniques, among others. A nano sheet mask may be used to pattern the stack of layers prior to etching. The etching process may have an etch stop at the base layer 104. After etching the stack of layers, a second dielectric material 106 (shown as "Dielectric 1" in the legend) can be deposited to surround the stack of layers using any suitable material deposition technique, as shown in the top view 200 and the cross-sectional view 202. After forming the second dielectric material 106, a CMP process may be performed.

Referring to FIG. 3, illustrated is a top view 300 and a cross-sectional view 302 of the next stage in the process flow. At this stage in the process flow, one or more openings (sometimes referred to herein as "source/drain openings") can be formed through the second dielectric material 106, adjacent to one or more corresponding sides of the now-etched base structure (e.g., the stack of layers). The source/drain openings can define the regions that will be occupied by contacts that form the source/drain of one or more transistor structures formed using the present techniques. The source/drain openings can be defined using a nano sheet mask 118 (shown in the legend as "Photoresist") over the top of the second dielectric material 106. Any suitable directional etching or material removal technique can be used, including but not limited to dry etching, wet etching, or plasma etching techniques, among others. Although two openings are shown here, it should be understood that any number of openings can be formed through the second dielectric material 106 for use in further process steps. After directionally etching the second dielectric material 106, the nano sheet mask 118 can be removed from the top of the base structure.

Referring to FIG. 4, illustrated is a top view 400 and a cross-sectional view 402 of the next stage in the process flow. At this stage in the process flow, the second sacrificial material 112 can be etched partially via the openings formed in the previous stage. The etching process used may be a selective etching process, which leaves the other layers and other materials shown in FIG. 4 intact while partially etching the second sacrificial material 112. However, in some implementations, a protective layer may be selectively deposited over the other layers in the stack of layers to protect those layers from the etching process used to recess the second sacrificial material 112. The protective layer can then be removed prior to performing further process steps. Etching the second sacrificial material 112 can create one or more recessed air gaps in the regions previously occupied by the second sacrificial material 112. Etching the second sacrificial material 112 in this manner can isolate metal contacts for the source/drain from the gate metal in later process steps, as will be described in greater detail herein.

Referring to FIG. 5, illustrated is a top view 500 and a cross-sectional view 502 of the next stage in the process flow. At this stage in the process flow, the openings etched through the second dielectric material 106 and the recessed air gaps formed by etching the second sacrificial material 112 can be deposit-filled with a third dielectric material 120 (shown as "Dielectric 4" in the legend). In some implementations, a CMP process may be performed after depositing the third dielectric material 120. Then, the third dielectric material 120 can be directionally etched until it is just below (e.g., exposing in the source/drain openings) the top of the first layer of the first sacrificial material 110, as shown in the cross-sectional view 502. Etching the third dielectric material 120 re-exposes the sides of the etched stack of layers (including the silicon 104) in the source/drain openings, while isolating the source/drain openings from the base layer 104. The third dielectric material 120 is directionally etched such that the recessed air gaps formed when etching the second sacrificial material 112 are now filled with the third dielectric material 120. In some implementations, the third dielectric material 120 can be directionally etched such that the base layer 104 is exposed in the source/drain openings.

Referring to FIG. 6, illustrated is a top view 600 and a cross-sectional view 602 of the next stage in the process flow. At this stage in the process flow, a layer of a fourth dielectric material 128 (shown in the legend as "Dielectric 6") can be deposited in the source/drain openings to protect the layers in the stack of layers from further process steps. To do so, a layer of the fourth dielectric material 128 can be deposited in the source/drain openings, using any suitable material deposition technique (e.g., ALD, CVD, PVD, PECVD, etc.). The fourth dielectric layer can be a substantially thin layer of material, such that it does not entirely fill the source/drain openings, as shown in the cross-sectional view 602. The fourth dielectric material 128 can then be directionally etched to expose the third dielectric material 120 in the source/drain openings, as shown in the top views 600.

Figure 7:
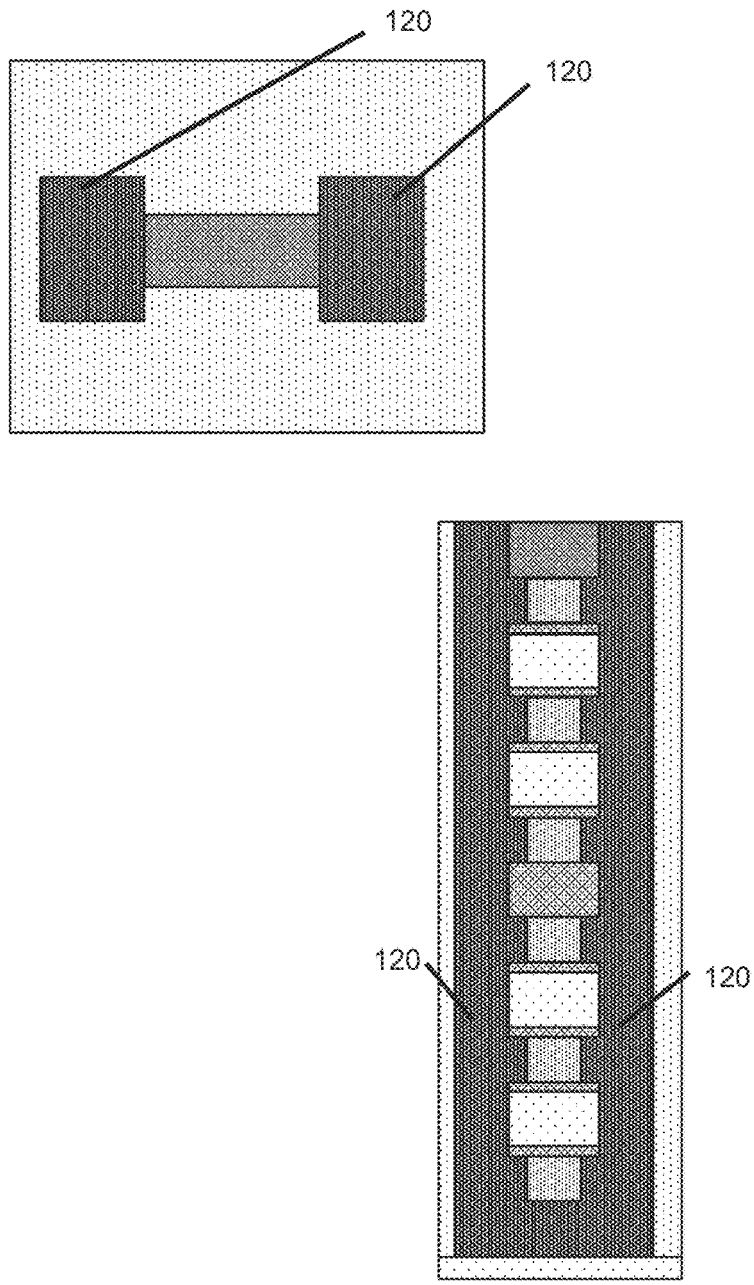

Referring to FIG. 7, illustrated is a top view 700 and a cross-sectional view 702 of the next stage in the process flow. At this stage in the process flow, both the third dielectric material 120 and the first layer of the first sacrificial material 110 can be removed via selective etching processes. Any suitable material removal technique can be used to remove the first layer (e.g., closest to the base layer 104) of the first sacrificial material 110 and the third dielectric material 120, as long as the removal technique is de-selective to the fourth dielectric material 128 (e.g., such that the fourth dielectric material 128 protects the other layers in the stack of layers from removal). The layer of the fourth dielectric material 128 can then be selectively removed using a suitable etching or removal technique. Then, the third dielectric material 120 can be formed in the source/drain openings using any suitable material deposition technique, such that the third dielectric material 120 fills both the source/drain openings and the openings formed by removing the first layer of the first sacrificial material 110, as shown in the cross-sectional view 702. A CMP process may then be performed. Deposit-filling the source/drain openings and the openings left by removing the first layer of the first sacrificial material 110 with the third dielectric material effectively isolates the stack of layers from the base layer 104.

Referring to FIG. 8, illustrated are top views 800, 806 and cross-sectional views 802, 804 of the next stage in the process flow. At this stage in the process flow, one or more gate openings can be formed through the second dielectric material 106, adjacent to one or more corresponding sides of the stack of layers, different from the sides adjacent to the source/drain openings. The gate openings can define the regions that will be occupied by active gate materials, including the gate metals, high-k dielectric materials, and other materials, for transistor structures formed using the present techniques. The gate openings can be defined using a nano sheet mask (not shown) over the top of the first dielectric material 116. Any suitable etching or material removal technique can be used, including but not limited to dry etching, wet etching, or plasma etching techniques, among others, to etch the second dielectric material 106 to form the gate openings. The gate openings may have an etch stop at the base layer 104, as shown in the top view 806.

Referring to FIG. 9, illustrated are top views 900, 906 and cross-sectional views 902, 904 of the next stage in the process flow. At this stage in the process flow, a fifth dielectric material 108 (shown as the "Dielectric 2" in the legend) can be formed in the bottom half of the gate openings, and a protective layer of a sixth dielectric material 126 (shown in the legend as "Dielectric 5") can be formed in the upper half of the gate openings. To form these dielectric layers, the fifth dielectric material 108 can be deposited in the gate opening using any suitable material deposition technique, and then directionally etched to be level with about halfway through the stack of materials, as shown. Then, a relatively thin layer of the sixth dielectric material 126 can be deposited in the gate openings, using any suitable material deposition technique (e.g., ALD, CVD, PVD, PECVD, etc.). The sixth dielectric material 126 can be deposited such that it does not entirely fill the upper half of the gate openings, and instead acts as a protective barrier for the stack of layers. The sixth dielectric material 126 can then be directionally etched to expose the top of the fifth dielectric material 108 in the gate openings, as shown in the top views 900 and 906.

Referring to FIG. 10, illustrated are top views 1000, 1006 and cross-sectional views 1002, 1004 of the next stage in the process flow. At this stage in the process flow, the fifth dielectric material 108 can be selectively etched until the fifth dielectric material 108 is just below the bottom of the second layer of the first sacrificial material 110, as shown in the cross-sectional views 1002. The removal technique used to partially remove the fifth dielectric material 108 can be de-selective to the sixth dielectric material 126, such that the sixth dielectric material 126 acts as a protective barrier for the layers in the upper half of the stack of layers. Then, the second dielectric material 112 in the bottom half of the stack of layers can be removed using a suitable selective etching technique. In some implementations, the etching technique used to remove the fifth dielectric material 108 may also be used to remove the second sacrificial material 112 (e.g., the etching technique is selective to both the fifth dielectric material 108 and the second sacrificial material 112).

Referring to FIG. 11, illustrated are top views 1100, 1106 and cross-sectional views 1102, 1104 of the next stage in the process flow. At this stage in the process flow, the first sacrificial material 110 (e.g., surrounding the layers of the silicon 104) can be removed from the bottom half of the stack of layers, as shown in the cross-sectional views 1102 and 1104. Any suitable material removal technique can be used to remove the first sacrificial material 110, including but not limited to dry etching, wet etching, or plasma etching techniques, among others. The etching technique used to remove the first sacrificial material 110 can be selective to the first sacrificial material 110, such that the other layers in the stack of layers remain intact (e.g., those in the upper half being protected by the sixth dielectric material 126, and the silicon 104 in the bottom half of the device). The space previously occupied by the first sacrificial material 110 that surrounded the silicon 104 can be used to form a channel material, and therefore the size of those layers of the first sacrificial material 110 may be selected in part based on the desired characteristics of the channel.

Referring to FIG. 12, illustrated are top views 1200, 1206 and cross-sectional views 1202, 1204 of the next stage in the process flow. At this stage in the process flow, a layer of a seed material 114 (shown as the "Seed Layer Nano sheet" in the legend) can be selectively deposited or selectively grown on the silicon 104. The seed material 114 can be, for example, $SiO_2$. However, it should be understood that other seed materials are also possible, which may be selectively grown or deposited on any type of semiconductor material. Generally, any material that can be selectively formed on a semiconductive substrate layer (e.g., the silicon 104) and that can behave as a seed layer for a 2D material, may be used as the seed material 114. The seed material 114 is formed in, but does not necessarily completely occupy, the space left after removing the layers of the first sacrificial material 110 previously in contact with the silicon 104. The type of the seed material 114 may be selected based on the desired type of 2D material to be formed. As shown in the cross-sectional view 1202, the seed material 114 may be formed to surround the silicon 104.

Referring to FIG. 13, illustrated are top views 1300, 1306 and cross-sectional views 1302, 1304 of the next stage in the process flow. At this stage in the process flow, the previously deposited layer of the seed material 114 may be recessed slightly to ensure that there is enough room to form the channel material. Any suitable selective etching technique may be used to recess the seed material 114. Then, a 2D material 130 (shown in the legend as "2D material") can be formed on the seed material 114. The 2D material 130 can be formed to surround the layer of the seed material 114, as shown in the cross-sectional view 1304. The 2D material 130 can be any type of suitable material that may act as a semiconductive-behaving material, and may include $WS_2$, $WSe_2$, $WTe_2$, $MoS_2$, $MoSe_2$, $MoTe_2$, $HfS_2$, $ZrS_2$, $TiS_2$, GaSe, InSe, InGaZrO, graphene, or phosphorene, among others. The 2D material 130 can be selectively deposited on the seed material 114. The 2D material 130 can be deposited using any suitable material deposition technique, including ALD, CVD, PVD, PECVD, or epitaxial techniques, among others.

Referring to FIG. 14, illustrated are top views 1400, 1406 and cross-sectional views 1402, 1404 of the next stage in the process flow. At this stage in the process flow, a high-k dielectric material 132 (shown as "High-K1" in the legend) can be selectively deposited the 2D material 130 via the gate opening. The high-k dielectric material 132 acts as a gate dielectric material for the channel formed from the 2D material 130 and the semiconductive-behaving material 130, which is defined by the 2D material 130. The high-k dielectric material 132 can be any type of material with a relatively high dielectric constant, and may be deposited at a predetermined thickness to achieve a desired capacitance. In some implementations, the high-k dielectric material 132 can be selectively deposited or grown, such that the high-k dielectric material 132 is deposited only on the 2D material 130. The high-k dielectric material 132 may be deposited using any suitable material deposition technique, including but not limited to ALD, CVD, PVD, PECVD, or epitaxial techniques, among others. Then, after forming the high-k dielectric material 132, a gate metal 122 (shown as "Metal 1" in the legend) can be selectively formed on the high-k dielectric material 132. The gate metal 122 may be deposited using any suitable material deposition technique, including but not limited to ALD, CVD, PVD, PECVD, or epitaxial techniques, among others. In some implementations, the gate metal 122 may be grown on the high-k dielectric material 132, such that the high-k dielectric material 132 behaves as a seed material for the gate metal 122.

Referring to FIG. 15, illustrated are top views 1500, 1506 and cross-sectional views 1502, 1504 of the next stage in the process flow. At this stage in the process flow, the remaining gaps in the gate openings can be filled with the sixth dielectric material 126. Any suitable material deposition technique can be used to form the sixth dielectric material 126. The sixth dielectric material can both fill any remaining gaps above the gate metal 122 and the remaining space in the gate openings. A CMP process may then be performed. Then, the sixth dielectric material 126 can be selectively etched down to just above the bottom of the layer of the second sacrificial material 112 in the upper half of the device, as shown in the cross-sectional view 1502. This exposes the upper half of the stack of layers in the gate openings for further process steps, while isolating the bottom transistors formed in prior process steps.

Referring to FIG. 16, illustrated are top views 1600, 1606 and cross-sectional views 1602, 1604 of the next stage in the process flow. At this stage in the process flow, similar processes to those described in connection with FIGS. 10-14 can be performed to form one or more similar transistor structures in an upper portion of the device. First, the second sacrificial material 112 and the first sacrificial material 110 can be removed, and a seed material 114 can be formed on the layers of the silicon 104. Then, the 2D material 130 can be formed on the seed material 114. In this example, a second high-k dielectric material 136 (shown as "High-K2" in the legend) can be formed on the 2D material 130, and a second gate metal 134 (shown as "Metal 3" in the legend) can be formed on the second high-k dielectric material 136. The second gate metal 134 may be different from the gate metal 122. Similarly, the second high-k dielectric material 136 may be different from the high-k material 132. Any 2D material with any polarity (e.g., N-type, P-type, etc.) may be chosen when forming the transistor structures described herein. The types of the second high-k dielectric material 136 and the second gate metal 134 can be selected to have desired material characteristics, and/or to correspond to the chosen polarity of the transistor (e.g., P-type or N-type), or based on the chosen 2D material 130. As shown, the second gate metal 134 can fill the remaining space in the gate openings. After forming the second gate metal 134, a CMP process may be performed.

Referring to FIG. 17, illustrated is a top view 1700 and a cross-sectional view 1702 of the next stage in the process flow. At this stage in the process flow, the third dielectric material 120 can be selectively etched in the source/drain openings to a predetermined height. As shown in the cross-sectional view 1702, this may be around the bottom of the gate metal 122 formed for the bottom transistor structure in the bottom half of the device. The etching process may be a directional etching process, such that the etching process does not remove the third dielectric material 120 that fills the recessed portions between the transistor structures in the stack of layers. Any suitable etching technique may be used, including but not limited to dry etching, wet etching, or plasma etching techniques, among others.

Referring to FIG. 18, illustrated is a top view 1800 and a cross-sectional view 1802 of the next stage in the process flow. At this stage in the process flow, each layer of the silicon 104 can be etched partially via the source/drain openings. The etching process used may be a selective etching process, which leaves the other materials intact while partially etching the silicon 104. However, in some implementations, a protective layer may be selectively deposited over the other layers in the stack of layers to protect those layers from the etching process used to recess the silicon 104. The protective layer can then be removed prior to performing further process steps. Etching the silicon 104 can create one or more recessed gaps in the regions previously occupied by the silicon 104. Etching the silicon 104 in this manner can isolate metal contacts for the source/drain from the gate metal in later process steps, as will be described in greater detail herein. After recessing each layer of the silicon 104, the source/drain openings and the recessed portions of the silicon 104 can be deposit-filled with the third dielectric material 120, and a CMP process may be performed.

Referring to FIG. 19, illustrated is a top view 1900, a cross-sectional view 1902, and a zoomed view 1904 of the next stage in the process flow. At this stage in the process flow, the third dielectric material 120 can be directionally etched until it is level with the bottom of the gate metal formed on the first transistor in the bottom half of the device, as shown in the cross-sectional view 1902. This exposes the stack of layers, including the high-k dielectric material 132 and the second high-k dielectric material 136 in the source/drain openings. Then, a portion of the high-k dielectric materials 132 can be recessed slightly, using any suitable selective etching technique, including but not limited to dry etching, wet etching, or plasma etching techniques, among others. Etching the high-k dielectric material 132 can provide more contact area between the source/drain material (formed in later process steps) and the 2D material 130 channel. The amount by which the high-k dielectric material 132 is recessed can be determined based on the desired contact area, which may be based on the desired characteristics of the transistor device. The etching process can be selective to the high-k dielectric material 132, such that the other layers in the stack of layers are substantially unaffected by the etching process. In some implementations, the etching process may be selective to both the high-k dielectric material 132 and the second high-k dielectric material 136.

Referring to FIG. 20, illustrated is a top view 2000, a cross-sectional view 2002, and a zoomed view 2004 of the next stage in the process flow. At this stage in the process flow, a first source/drain metal 124 (shown in the legend as "Metal 2") can be formed in the source/drain openings, such that the source/drain metal 124 is in contact with the 2D material 130, which forms the channel of the transistor. The source/drain metal 124 can be formed using any suitable material deposition technique, including ALD, CVD, PVD, PECVD, or epitaxial techniques, among others. In some implementations, the source/drain metal 124 can be formed such that it completely fills the source/drain openings, and then a CMP process can be performed. Then, the source/drain metal 124 can be directionally etched such that it contacts desired transistor structures (shown here as the bottom two transistor structures). In some implementations, the source/drain metal 124 can be formed to contact only one transistor structure. Other separate source/drain metals 124 can be formed in the source/drain openings by forming layers of dielectric material between the source/drain metals 124, as will be described herein.

Referring to FIG. 21, illustrated is a top view 2100, a cross-sectional view 2102, and a zoomed view 2104 of the next stage in the process flow. At this stage in the process flow, the source/drain openings can be filled with the fourth dielectric material 128, to fill any openings above the second doped material 124 in the source/drain openings. A CMP process may then be performed. The fourth dielectric material 128 can then be directionally etched to expose the portions of the silicon 104 in the source/drain openings at the top of the device. The fourth dielectric material 128 provides isolation between the top and bottom transistor metals. As described above, in some implementations, layers of the fourth dielectric material 128 may be formed between each transistor device, allowing each transistor structure in the stack to be isolated from one another.

Referring to FIG. 22, illustrated are top views 2200, 2206 and cross-sectional views 2202, 2204 of the next stage in the process flow. At this stage in the process flow, second source/drain metal 138 (shown in the legend as "Metal 4") can be formed in the source/drain openings. The second/source/drain metal 138 can be formed using any suitable material deposition technique, including ALD, CVD, PVD, or PECVD, among others. The second source/drain metal 138 may be different from the source/drain metal 124, and may be chosen based on the type or polarity of the 2D material 130. As shown, the second source/drain metal 138 can be formed to fill the remaining open portions of the source/drain openings 138. The second source/drain metal 138 contacts the 2D material formed in the top two transistor structures. After forming the second source/drain metal 183, a CMP process can be performed to finalize the device. Although not shown here for the sake of simplicity, it should be understood that electric connections between any of the source/drain metal 124, the second source/drain metal 138, the gate metal 122, and the second gate metal 134, may be formed to define logical circuits. Additionally, although only one stack of transistor structures has been shown in the preceding process steps, it should be understood that any number of transistor structures may be formed using the present techniques in the x-y directions (e.g., in the same plane), or in the z-direction, to create a stack of N transistors.

Referring to FIG. 23, illustrated is a flow diagram of a method 2300 for fabricating semiconductor devices. The method 2300 may include steps 2305-2325. However, other embodiments may include additional or alternative steps, or may omit one or more steps altogether.

Referring to step 2305, the method 2300 includes forming a bridge-like structure of a semiconductor material (e.g., silicon 104). The method may include forming a dielectric material on a first side and a second side of a stack of layers (as shown in FIG. 1), the stack of layers including a layer of the semiconductor material. One or more layers (e.g., sacrificial material) of the stack of layers may be removed (e.g., as described with respect to FIG. 11) to expose the semiconductor material. As a result, a first end of the semiconductor material contacts the first side of the dielectric layer and a second end of the semiconductor material contacts the second side of the dielectric layer.

At step 2310, the method 2300 includes selectively forming a seed material (e.g., the seed material 114) around the semiconductor material. To form the seed material, the process steps described in connection with FIGS. 3-12 can be performed. The seed material may be formed in one or more gate openings in the base structure, and may be formed to surround a portion of the substrate material. The seed material can be any suitable material on which a 2D material may be selectively formed or deposited.

At step 2315, the method 2300 includes selectively forming a 2D material (e.g., the 2D material 130) around the seed material. To form the 2D material, the process steps described in connection with FIG. 13 may be performed. The 2D material can be formed to partially surround a portion of the seed material, such that the 2D material is separated from the substrate material by the layer of the seed material.

At step 2320, the method 2300 includes forming an active gate (e.g., the high-k dielectric material 130 or the second high-k dielectric material 136, and the gate metal 122 or the second gate metal 134) around a central portion of the 2D material, thereby exposing end portions of the 2D material. The active gate can be formed by performing the process steps described in connection with FIG. 14. If more than one type or polarity of 2D material is used in the base structure, the steps described in connection with FIGS. 15 and 16 can also be performed to form an active gate made of different material in the same base structure.

At step 2325, the method 2300 includes forming (e.g., growing or depositing) source/drain structures (e.g., the source/drain metal 124 or the second source/drain metal 138) coupled to the end portions of the 2D material, respectively. To form the source/drain structures, the process steps described in connection with FIGS. 17-20 can be performed. To form additional (e.g., second) source/drain structures in the base structure, the process steps described in connection with FIGS. 21-22 can be performed.

Having now described some illustrative implementations and implementations, it is apparent that the foregoing is illustrative and not limiting, having been presented by way of example. In particular, although many of the examples presented herein involve specific combinations of method acts or system elements, those acts and those elements may be combined in other ways to accomplish the same objectives. Acts, elements and features discussed only in connection with one implementation are not intended to be excluded from a similar role in other implementations or implementations.

The phraseology and terminology used herein is for the purpose of description and should not be regarded as limiting. The use of "including" "comprising" "having" "containing" "involving" "characterized by" "characterized in that" and variations thereof herein, is meant to encompass the items listed thereafter, equivalents thereof, and additional items, as well as alternate implementations consisting of the items listed thereafter exclusively. In one implementation, the systems and methods described herein consist of one, each combination of more than one, or all of the described elements, acts, or components.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Any references to implementations or elements or acts of the systems and methods herein referred to in the singular may also embrace implementations including a plurality of these elements, and any references in plural to any implementation or element or act herein may also embrace implementations including only a single element. References in the singular or plural form are not intended to limit the presently disclosed systems or methods, their components, acts, or elements to single or plural configurations. References to any act or element being based on any information, act or element may include implementations where the act or element is based at least in part on any information, act, or element.

Any implementation disclosed herein may be combined with any other implementation, and references to "an implementation," "some implementations," "an alternate implementation," "various implementation," "one implementation" or the like are not necessarily mutually exclusive and are intended to indicate that a particular feature, structure, or characteristic described in connection with the implementation may be included in at least one implementation. Such terms as used herein are not necessarily all referring to the same implementation. Any implementation may be combined with any other implementation, inclusively or exclusively, in any manner consistent with the aspects and implementations disclosed herein.

References to "or" may be construed as inclusive so that any terms described using "or" may indicate any of a single, more than one, and all of the described terms.

Where technical features in the drawings, detailed description or any claim are followed by reference signs, the reference signs have been included for the sole purpose of increasing the intelligibility of the drawings, detailed description, and claims. Accordingly, neither the reference signs nor their absence have any limiting effect on the scope of any claim elements.

The preceding description of the disclosed embodiments is provided to enable any person skilled in the art to make or use the embodiments described herein and variations thereof. Various modifications to these embodiments will be readily apparent to those skilled in the art, and the principles defined herein may be applied to other embodiments without departing from the spirit or scope of the subject matter disclosed herein. Thus, the present disclosure is not intended to be limited to the embodiments shown herein but is to be accorded the widest scope consistent with the following claims and the principles and novel features disclosed herein.

While various aspects and embodiments have been disclosed, other aspects and embodiments are contemplated. The various aspects and embodiments disclosed are for purposes of illustration and are not intended to be limiting, with the true scope and spirit being indicated by the following claims.

What is claimed is:

1. A device, comprising:
   a semiconductor material;
   a pair of first dielectric materials in contact with the semiconductor material through only respective ends of the semiconductor material;
   a seed material wrapping around the semiconductor material and the pair of first dielectric materials, except sidewalls of the pair of first dielectric materials;
   a two-dimensional (2D) material wrapping around the seed material;
   an active gate wrapping around the 2D material; and
   a pair of source/drain structures in contact with the 2D material.

2. The device of claim 1, further comprising:
   a pair of second dielectric materials coupled to both ends of an upper portion of the active gate; and
   a pair of third dielectric materials coupled to both ends of a lower portion of the active gate.

3. The device of claim 2, wherein the pair of second dielectric materials are configured to electrically isolate at least the upper portion of the active gate from the pair of source/drain structures, and wherein the pair of third dielectric materials are configured to electrically isolate at least the lower portion of the active gate from the pair of source/drain structures.

4. The device of claim 1, wherein the seed material includes an oxidized portion of the semiconductor material.

5. The device of claim 1, wherein the active gate comprises:
   a high-k dielectric material around a portion of the 2D material; and
   a gate metal around a portion of the high-k dielectric material.

6. The device of claim 5, wherein the portion of the 2D material has a first length and the portion of the high-k dielectric material has a second length, the first length being longer than the second length.

7. The device of claim 1, further comprising:
a second semiconductor material;
a pair of second dielectric materials in contact with the second semiconductor material through only respective ends of the second semiconductor material;
a second seed material wrapping around the second semiconductor material and the pair of second dielectric materials, except sidewalls of the pair of second dielectric materials;
a second 2D material wrapping around the second seed material;
a second active gate wrapping around the second 2D material; and
a second pair of source/drain structures coupled to the 2D material.

8. The device of claim 7, wherein the 2D material is an N-type material and the second 2D material is a P-type material.

9. A transistor structure comprising:
a source metal;
a drain metal;
a two-dimensional (2D) channel material partially wrapping around a semiconductor material that extends between the source metal and the drain metal, wherein a first end of the semiconductor material is in contact with only a first dielectric material, and a second end of the semiconductor material is in contact with only a second dielectric material;
a high-k dielectric partially wrapping around the 2D channel material;
a gate metal partially wrapping around the high k-dielectric;
a first dielectric isolating the gate metal from the source metal; and
a second dielectric isolating the gate metal from the drain metal.

10. The transistor structure of claim 9, further comprising a seed material around the semiconductor material, wherein the 2D channel material is coupled to the seed material.

11. The transistor structure of claim 9, wherein the source metal and the drain metal are coupled to the 2D channel material and the high-k dielectric material.

* * * * *